(12) United States Patent
Iwata et al.

(10) Patent No.: US 9,365,948 B2
(45) Date of Patent: Jun. 14, 2016

(54) GROUP III NITRIDE CRYSTAL AND MANUFACTURING METHOD THEREOF

(71) Applicants: Hirokazu Iwata, Miyagi (JP); Seiji Sarayama, Miyagi (JP); Akihiro Fuse, Miyagi (JP)

(72) Inventors: Hirokazu Iwata, Miyagi (JP); Seiji Sarayama, Miyagi (JP); Akihiro Fuse, Miyagi (JP)

(73) Assignee: RICOH COMPANY, LTD, Tokyo (JP)

( * ) Notice: Subject to any disclaimer, the term of this patent is extended or adjusted under 35 U.S.C. 154(b) by 773 days.

(21) Appl. No.: 13/647,194

(22) Filed: Oct. 8, 2012

(65) Prior Publication Data

US 2013/0028826 A1 Jan. 31, 2013

Related U.S. Application Data

(62) Division of application No. 11/561,662, filed on Nov. 20, 2006, now Pat. No. 8,323,404.

(30) Foreign Application Priority Data

Nov. 21, 2005 (JP) ................................. 2005-335684

(51) Int. Cl.
| | |
|---|---|
| *C30B 29/38* | (2006.01) |
| *C30B 9/00* | (2006.01) |
| *C30B 29/40* | (2006.01) |
| *H01L 21/02* | (2006.01) |

(52) U.S. Cl.
CPC ................. *C30B 9/00* (2013.01); *C30B 29/403* (2013.01); *H01L 21/0242* (2013.01); *H01L 21/0254* (2013.01); *H01L 21/02458* (2013.01); *H01L 21/02573* (2013.01); *H01L 21/02595* (2013.01); *H01L 21/02625* (2013.01); *H01L 21/02639* (2013.01); *H01L 21/02647* (2013.01)

(58) Field of Classification Search
CPC ........ C30B 29/38; C30B 29/406; C30B 31/02
See application file for complete search history.

(56) References Cited

U.S. PATENT DOCUMENTS

| | | |
|---|---|---|
| 5,021,119 A | 6/1991 | Fan et al. |
| 5,868,837 A | 2/1999 | Disalvo et al. |
| 5,888,837 A | 3/1999 | Fillion et al. |
| 6,592,663 B1 | 7/2003 | Sarayama et al. |
| 6,780,239 B2 | 8/2004 | Sarayama et al. |
| 6,949,140 B2 | 9/2005 | Sarayama et al. |

(Continued)

FOREIGN PATENT DOCUMENTS

| | | |
|---|---|---|
| JP | 2001-58900 | 3/2001 |
| JP | 2001-64097 | 3/2001 |

(Continued)

OTHER PUBLICATIONS

Office Action issued Oct. 19, 2010, in Japanese Patent Application No. 2005-335684, filed Nov. 21, 2005.

*Primary Examiner* — Robert M Kunemund
(74) *Attorney, Agent, or Firm* — Oblon, McClelland, Maier & Neustadt, L.L.P.

(57) ABSTRACT

A group III nitride crystal containing therein an alkali metal element comprises a base body, a first group III nitride crystal formed such that at least a part thereof makes a contact with the base body, the first group III nitride crystal deflecting threading dislocations in a direction different from a direction of crystal growth from the base body and a second nitride crystal formed adjacent to the first group III nitride crystal, the second nitride crystal having a crystal growth surface generally perpendicular to the direction of the crystal growth.

5 Claims, 24 Drawing Sheets

(56) References Cited

U.S. PATENT DOCUMENTS

| | | |
|---|---|---|
| 7,001,457 B2 | 2/2006 | Sarayama et al. |
| 7,220,311 B2 | 5/2007 | Iwata et al. |
| 7,250,640 B2 | 7/2007 | Sarayama et al. |
| 7,261,775 B2 | 8/2007 | Iwata et al. |
| 7,309,534 B2 | 12/2007 | Kitaoka et al. |
| 7,462,238 B2 | 12/2008 | Sarayama et al. |
| 7,508,003 B2 | 3/2009 | Sarayama et al. |
| 7,524,691 B2 | 4/2009 | Kitaoka et al. |
| 7,531,038 B2 | 5/2009 | Sarayama et al. |
| 2005/0082564 A1 | 4/2005 | Kitaoka et al. |
| 2007/0128746 A1 | 6/2007 | Iwata et al. |
| 2007/0215033 A1 | 9/2007 | Imaeda et al. |
| 2009/0120354 A1 | 5/2009 | Sarayama et al. |

FOREIGN PATENT DOCUMENTS

| | | |
|---|---|---|
| JP | 2001-64098 | 3/2001 |
| JP | 2001-102316 | 4/2001 |
| JP | 2001-119103 | 4/2001 |
| JP | 2002-128586 | 5/2002 |
| JP | 2002-134416 | 5/2002 |
| JP | 2002-201100 | 7/2002 |
| JP | 2002-326898 | 11/2002 |
| JP | 2002-338397 | 11/2002 |
| JP | 2003-12400 | 1/2003 |
| JP | 2003-81696 | 3/2003 |
| JP | 2003-160398 | 6/2003 |
| JP | 2003-160399 | 6/2003 |
| JP | 2003-206198 | 7/2003 |
| JP | 2003-212696 | 7/2003 |
| JP | 2003-238296 | 8/2003 |
| JP | 2003-286098 | 10/2003 |
| JP | 2003-286099 | 10/2003 |
| JP | 2003-292400 | 10/2003 |
| JP | 2003-300798 | 10/2003 |
| JP | 2003-300799 | 10/2003 |
| JP | 2003-313097 | 11/2003 |
| JP | 2003-313098 | 11/2003 |
| JP | 2003-313099 | 11/2003 |
| JP | 2004-168650 | 6/2004 |
| JP | 2004-189590 | 7/2004 |
| JP | 2004-231447 | 8/2004 |
| JP | 2004-277224 | 10/2004 |
| JP | 2004-307322 | 11/2004 |
| JP | 2005-247594 | 9/2005 |
| JP | 2005-247625 | 9/2005 |

GROUP III NITRIDE CRYSTAL AND MANUFACTURING METHOD THEREOF

CROSS-REFERENCE TO RELATED APPLICATIONS

This application is a divisional of U.S. patent application Ser. No. 11/561,662 filed Nov. 20, 2006 now U.S. Pat. No. 8,323,404 and claims priority of Japanese patent application no. 2005-335684 filed Nov. 21, 2005.

TECHNICAL FIELD

The present invention relates to group III nitride crystals and manufacturing method thereof.

These days, most of the InGaAlN (a group III nitride semiconductor) devices used for ultraviolet, purple, blue and green optical sources are formed on a substrate of sapphire or silicon carbide (SiC) by conducting thereon an MOCVD process (metal-organic chemical vapor deposition process) or MBE process (molecular beam epitaxy process).

In the case sapphire or silicon carbide is used for the substrate, however, there are formed a large number of crystal defects in the group III nitride semiconductor layers grown thereon in view of the fact that there exists a large difference in the thermal expansion coefficient and lattice constant between the substrate and the group III nitride semiconductor layers. Such crystal defects invite deterioration of device performance and are related directly to the drawbacks such as short lifetime, large operational power, and the like, in the case a light-emitting device is formed on such a substrate.

Further, because a sapphire substrate is an insulator, it is impossible to provide an electrode directly on the substrate contrary to conventional light-emitting devices. This means that it is necessary to provide an electrode on one of the group III nitride semiconductor layers. However, such a construction necessitates large device area for formation of the electrodes and the cost of the device is increased inevitably. In addition, there is caused a problem of warp of the substrate because of combination of different materials such as use of a sapphire substrate in combination with a group III nitride semiconductor layer. This problem of warp becomes a serious problem particularly when the device area is increased.

Further, with the group III nitride semiconductor devices constructed on a sapphire substrate, chip separation by way of cleaving process is difficult, and it is not easy to obtain an optical cavity edge surface, which is required in laser diodes (LD). Because of this, it has been practiced in the art, when to form an optical cavity edge surface, to conduct a separation process somewhat similar to a cleaving process after reducing the thickness of the sapphire substrate to 100 μm or less by conducting polishing process, or by conducting a dry etching process. Thus, it has been difficult to conduct formation of optical cavity edge surface and chip separation with a single step, contrary to the production process of conventional laser diodes, and there has been a problem of increased cost because of the complexity of the fabrication process of light-emitting devices.

In order to solve these problems, there has been made a proposal for reducing the crystal defects by conducting selective growth process of the group III nitride semiconductor layers on the sapphire substrate in a lateral direction. With this approach, it has become possible to reduce the crystal defects successfully, while there still remain problems of insulating nature of the sapphire substrate and difficulty of cleaving a sapphire substrate with such a construction.

In order to solve these problems, use of a gallium nitride (GaN) substrate of generally the same composition to the crystalline materials grown thereon is preferable. Thus, various attempts have been made for growing a bulk GaN crystal by vapor phase growth process or melt growth process. However, GaN substrate of high quality and practical size is not yet realized.

As one approach of realizing a GaN bulk crystal substrate, there is proposed a GaN crystal growth process that uses sodium (Na) for the flux (Patent Reference 1). According to this method, sodium azide ($NaN_3$) and metal Ga are confined in a reaction vessel of stainless steel (vessel dimension: inner diameter=7.5 mm; length=100 mm) as the source material, together with a nitrogen gas, and a GaN crystal is grown by holding the reaction vessel at a temperature of 600-800° C. for 24-100 hours.

According to this method, it has become possible to carry out the crystal growth at relatively low temperature of 600-800° C. while maintaining the pressure inside the vessel to a relatively low pressure of 100 kg/cm$^2$ or less. This means that crystal growth can be conducted under a practical condition.

Further, there is realized a high quality group III nitride crystal by causing a reaction between a group V source material including nitrogen and a melt mixture of an alkali metal and a group III metal (Patent Reference 2).

Patent Reference 1 U.S. Pat. No. 5,868,837
Patent Reference 2 Japanese Laid-Open Patent Application 2001-58900

DISCLOSURE OF THE INVENTION

In the case of growing a group III nitride crystal on a base body by reacting a melt mixture of alkali metal and group III metal with a group V source material including nitrogen, on the other hand, there arises a problem, when the base body contains dislocations, in that there occurs crystal growth of a group III nitride that reflects such dislocations of the underlying base body. Therefore, it is difficult to reduce the dislocation density with the group III nitride crystal thus grown.

The present invention has been made in view of the foregoing problems and has its object of providing a group III nitride crystal grown by a crystal growth process that uses alkali metal for a flux while reducing threading dislocations.

Another object of the present invention is to provide a manufacturing method of a group III nitride crystal that uses an alkali metal for flux while reducing threading dislocations.

According to the present invention, the group III nitride crystal contains an alkali metal element as an impurity and includes a base body and first and second group III nitride crystals. The first group III nitride crystal is formed such that at least a part thereof makes a contact with the base body and deflects threading dislocations in a direction different from a direction of crystal growth from the base body. The second nitride crystal is formed adjacent to the first group III nitride crystal and has a crystal growth surface generally perpendicular to the direction of the crystal growth.

In a preferred embodiment, the first group III nitride crystal has a crystal growth surface different from a c-surface or a plane parallel to a c-axis.

In a preferred embodiment, the second group III nitride crystal has a crystal growth direction in the c-axis direction.

In a preferred embodiment, the underlying body is a substrate of a material different from a material of the group III nitride crystal.

In a preferred embodiment, the base body comprises a substrate and a third group III nitride crystal. The substrate comprises a material different from a material of the group III nitride crystal. The third group III nitride crystal is formed on the substrate and includes threading dislocations. Further, at least a part of the first nitride crystal is formed adjacent to the third nitride crystal.

In a preferred embodiment, the third group III nitride is formed of plural crystals disposed with a predetermined interval.

In a preferred embodiment, the predetermined interval is determined by a size of a semiconductor device formed by using the second group III nitride.

In a preferred embodiment, the base body comprises a group III nitride crystal.

In a preferred embodiment, the base body comprises a seed crystal and a third group III nitride crystal. The seed crystal comprises a group III nitride crystal. The third group III nitride crystal is formed adjacent to the seed crystal and includes threading dislocations. Further, at least a part of the first nitride crystal is formed adjacent to the third nitride crystal.

In a preferred embodiment, the third group III nitride crystal has a threading dislocation density of $10^6$-$10^{10}$ cm$^{-2}$.

Further, the present invention provides a manufacturing method for manufacturing a group III nitride crystal on a base body by using a crystal growth apparatus including a reaction vessel holding a melt mixture containing therein an alkali metal and a group III metal, the method comprising: a first step of loading an alkali metal and a group III nitride into a reaction vessel in an ambient of an inert gas or a nitrogen gas; a second step of filling a vessel space in the reaction vessel with a nitrogen gas; a third step of heating the reaction vessel to a crystal growth temperature; a fourth step of growing a first group III nitride crystal on the base body, such that the first group III nitride crystal causes deflection of threading dislocations in a direction different from a crystal growth direction from the base body; a fifth step of growing a second group III nitride crystal having a crystal growth surface generally perpendicular to a crystal growth direction such that at least of a part of the second group III nitride crystal makes a contact with the first group III nitride crystal; and a sixth step of supplying a nitrogen source gas to the reaction vessel such that a pressure of the vessel space is held at a predetermined pressure.

In a preferred embodiment, the fourth step causes crystal growth of the first group III nitride crystal such that the first group III nitride crystal has a crystal growth surface different from a c-surface or a plane parallel to a c-axis.

In a preferred embodiment, the fourth step causes crystal growth of the first group III nitride crystal by controlling the mixing ratio of the alkali metal and the group III metal and the nitrogen source gas pressure in the vessel space within the range of crystal growth condition in which there occurs no new nucleation in the melt mixture.

In a preferred embodiment, the fourth step causes the crystal growth of the first group III nitride crystal by relatively lowering the nitrogen source gas pressure when the mixing ratio is relatively large and causes the crystal growth of the first group III nitride by relatively increasing the nitrogen source gas pressure when the mixing ratio is relatively small.

In a preferred embodiment, the fifth step causes crystal growth of the second group III nitride crystal by adding an additive different from the alkali metal or the group III metal to the melt mixture.

In a preferred embodiment, the fifth step causes the crystal growth of the second group III nitride crystal by adding the additive to the melt mixture under the crystal growth condition for growing the first group III nitride crystal.

In a preferred embodiment, the alkali metal comprises sodium, the group III metal comprises gallium, and the additive comprises lithium.

In a preferred embodiment, the lithium is used in the melt mixture of sodium and gallium with a concentration of 0.5-0.8 mol.

In a preferred embodiment, the manufacturing method further comprises a seventh step of dipping the base body to the melt mixture.

In a preferred embodiment, the manufacturing method further comprises a seventh step of contacting the base body to the vapor-liquid interface between the melt mixture and the vessel space.

In a preferred embodiment, the manufacturing method further comprises an eighth step of moving the base body with the growth of the first and second group III nitride crystal such that the crystal growth surface makes contact with the vapor-liquid interface.

In a preferred embodiment, the underlying body is a substrate of a material different from a material of the group III nitride crystal.

In a preferred embodiment, the base body comprises a substrate and a third group III nitride crystal. The substrate comprises a material different from a material of the group III nitride crystal. The third group III nitride crystal is formed on the substrate and includes threading dislocations. Further, the fourth step causes the crystal growth of the first group III nitride crystal in contact with the third group III nitride crystal.

In a preferred embodiment, third group III nitride is formed of plural crystals each having a predetermined width and disposed with a predetermined interval.

In a preferred embodiment, the base body comprises a low-grade seed crystal of the group III nitride and contains threading dislocations.

In a preferred embodiment, the base body comprises a seed crystal and a third group III nitride crystal. The seed crystal comprises a group III nitride crystal. The third group III nitride crystal is formed adjacent to the seed crystal and includes threading dislocations. Further, the fourth step causes the crystal growth of the first group III nitride crystal in contact with the third group III nitride crystal.

According to the present invention, a group III nitride crystal containing therein an alkali metal is manufactured by consecutively causing crystal growth processes of the first group III nitride crystal that deflects the threading dislocations in the direction different from the direction of crystal growth from the base body, and the second group III nitride crystal having a crystal growth surface generally perpendicular to the crystal growth direction of the first group III nitride crystal. As a result, the threading dislocations penetrating into the second group III nitride crystal is reduced.

Thus, according to the present invention, it becomes possible to decrease the threading dislocations in the group III nitride crystal.

DETAILED DESCRIPTION OF THE PREFERRED EMBODIMENT

Figure 1:
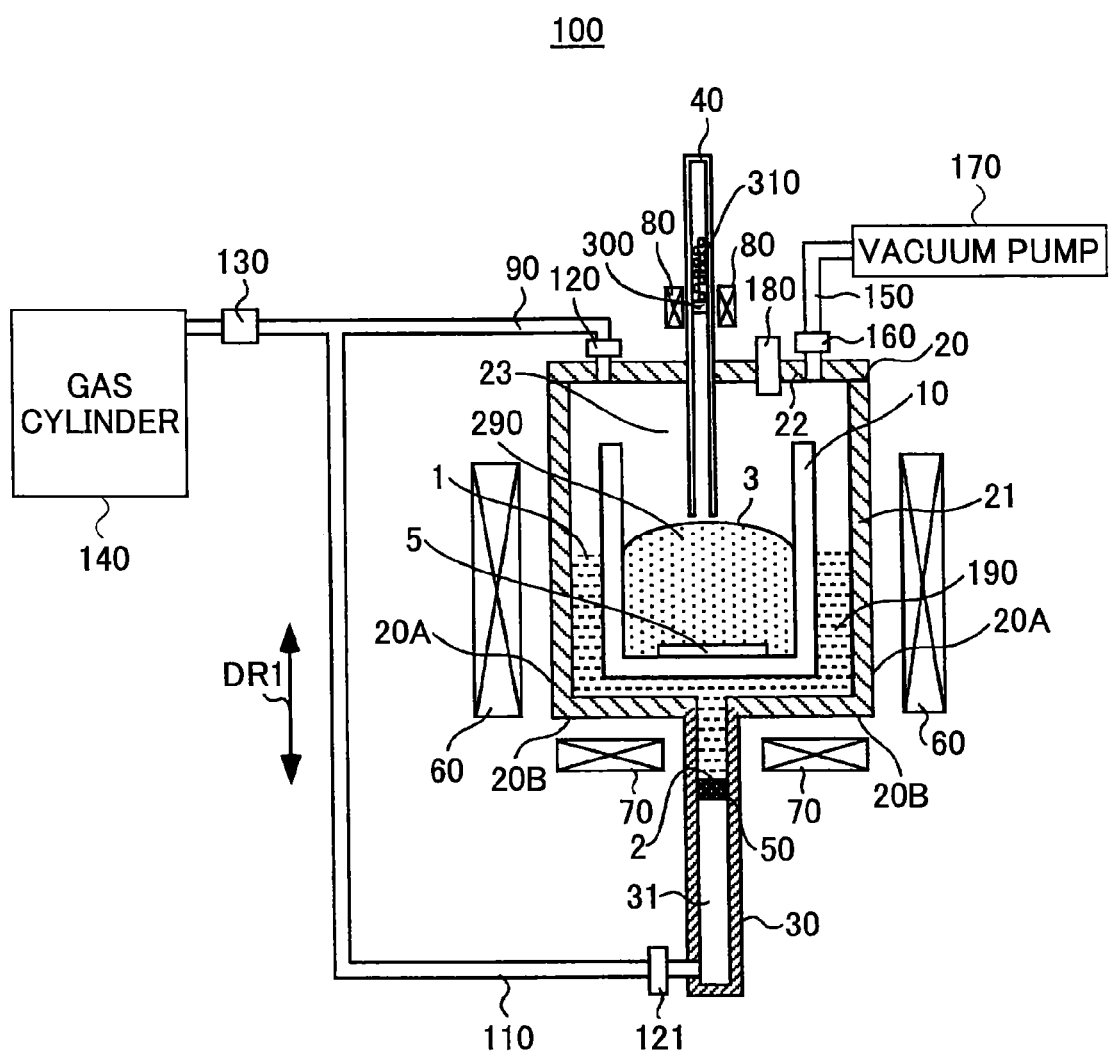
FIG. 1 is a schematic cross-sectional diagram showing the construction of a crystal growth apparatus according to Embodiment 1 of the present invention.

Hereinafter, the present invention will be described for embodiments with reference to the drawings. In the drawings, those parts corresponding to the parts are designated by the same reference numerals and the description thereof will be not repeated.

[Embodiment 1]

FIG. 1 is a schematic cross-sectional diagram showing the construction of a crystal growth apparatus according to Embodiment 1 of the present invention. Referring to FIG. 1, the crystal growth apparatus 100 of Embodiment 1 comprises a reaction vessel 10, an outer reaction vessel 20, conduits 30 and 40, a stopper/inlet plug 50, heating units 60, 70 and 80, gas supply lines 90 and 110, valves 120, 121 and 160, a pressure regulator 130, a gas cylinder 140, an evacuation line 150, a vacuum pump 170, a pressure sensor 180, and a metal melt 190.

The reaction vessel 10 has a generally cylindrical form and is formed of boron nitride (BN). The outer reaction vessel 20 is disposed around the reaction vessel 10 with a predetermined separation from the reaction vessel 10. Further, the outer reaction vessel 20 is formed of a main part 21 and a lid 22. Each of the main part 21 and the lid 22 is formed of SUS 316L stainless steel, wherein a metal seal ring is provided between the main part 21 and the lid 22 for sealing. Thus, there occurs no leakage of a melt mixture 290 to be described later to the outside of the reaction vessel 1020.

The conduit 30 has a generally cylindrical pillar-shaped form and is connected to the outer reaction vessel 20 at the underside of the reaction vessel 10 in terms of a gravitational direction DR1. The conduit 40 has a generally cylindrical pillar-shaped form and is fixed upon the outer reaction vessel at the upper side of the reaction vessel 10 in terms of the gravitational direction DR1 such that a part thereof is inserted into a space 23 inside the outer reaction vessel 20 via the outer reaction vessel 20.

The stopper/inlet plug 50 may be formed of a metal, ceramic, or the like, for example, and is held inside the conduit 20 at a location lower than the connection part of the outer reaction vessel 30 and the conduit 30.

The heating unit 60 is disposed so as to surround the outer circumferential surface 20A of the outer reaction vessel 20. On the other hand, the heating unit 70 is disposed so as to face a bottom surface 20B of the outer reaction vessel 20. The heating unit 80 is disposed so as to surround a part of the conduit 40.

The gas supply line 90 has an end connected to the outer reaction vessel 20 via the valve 120 and the other end connected to the gas cylinder 130 via the pressure regulator 140. The gas supply line 110 has an end connected to the conduit 30 via the valve 121 and the other end connected to the gas supply line 90.

The valve 120 is connected to the gas supply line 90 in the vicinity of the outer reaction vessel 20, the valve 121 is connected to the gas supply line 110 in the vicinity of the conduit 30, the pressure regulator 130 is connected to the gas supply line 90 in the vicinity of the gas cylinder 140, and the gas cylinder 140 is connected to the gas supply line 90.

The evacuation line 150 has an end connected to the outer reaction vessel 20 via the valve 160 and the other end connected to the vacuum pump 170. The valve 160 is connected to the evacuation line 150 in the vicinity of the outer reaction vessel 20. The vacuum pump 170 is connected to the evacuation line 150.

The pressure sensor 180 is mounted to the outer reaction vessel 20. The metal melt 190 comprises a melt of metal sodium (metal Na) and is held between the reaction vessel 10 and outer the reaction vessel 20 and inside the conduit 30.

The reaction vessel 10 holds the melt mixture 290 containing therein metal Na and metal gallium (metal Ga). The outer reaction vessel 20 surrounds the reaction vessel 10. The conduit 30 leads the nitrogen gas (N2 gas) supplied from the gas cylinder 140 via the gas supply lines 90 and 110 to the stopper/inlet plug 50.

The conduit 40 holds therein the metal Ga 300 and metal lithium (metal Li) 310. The stopper/inlet plug 50 has a dimple structure on the outer peripheral surface such that there are formed apertures of the size of several ten microns between the inner wall of the conduit 30 and the stopper/inlet plug 50. Thus, the stopper/inlet plug 50 allows the nitrogen gas in the conduit 30 to pass in the direction to the metal melt 190 and supplies the nitrogen gas to the space 23 via the metal melt 190. Further, the stopper/inlet plug 50 holds the metal melt 190 between the reaction vessel 10 and the outer reaction vessel 20 and further in the conduit 30 by the surface tension caused by the apertures of the size of several ten microns.

The heating unit 60 heats the reaction vessel 10 and the outer reaction vessel 20 to the crystal growth temperature from the outer peripheral surface 20A of the outer reaction vessel 20. The heating unit 70 heats the reaction vessel 10 and the outer reaction vessel 20 to the crystal growth temperature from the bottom surface 20B of the outer reaction vessel 20. The heating unit 80 heats the metal Ga 300 held in the conduit 40 to 30° C. or higher, wherein it should be noted that the metal Ga has the melting temperature of 30° C.

The gas supply line 90 supplies the nitrogen gas supplied from the gas cylinder 140 via the pressure regulator 130 to the interior of the outer reaction vessel 20 via the valve 120. The gas supply line 110 supplies the nitrogen gas supplied from the gas cylinder 140 via the pressure regulator 130 to the interior of the conduit 30 via the valve 121.

The valve 120 supplies the nitrogen gas inside the gas supply line 90 to the interior of the outer reaction vessel 20 or interrupts the supply of the nitrogen gas to the interior of the outer reaction vessel 20. The valve 121 supplies the nitrogen gas inside the gas supply line 110 to the conduit 30 or interrupts the supply of the nitrogen gas to the conduit 30. The pressure regulator 130 supplies the nitrogen gas from the gas cylinder 140 to the gas supply lines 90 and 110 after setting the pressure to a predetermined pressure.

The gas cylinder 140 holds the nitrogen gas. The evacuation line 150 passes the gas inside the outer reaction vessel 20 to the vacuum pump 170. The valve 160 connects the interior of the outer reaction vessel 20 and the evacuation line 150 spatially or disconnects the interior of the outer reaction vessel 20 and the evacuation line 150 spatially. The vacuum pump 170 evacuates the interior of the outer reaction vessel 20 via the evacuation line 150 and the valve 160.

The pressure sensor 180 detects the pressure inside the outer reaction vessel 20. The metal melt 190 supplies the nitrogen gas introduced through the stopper/inlet plug 50 into the space 23.

Figure 2:
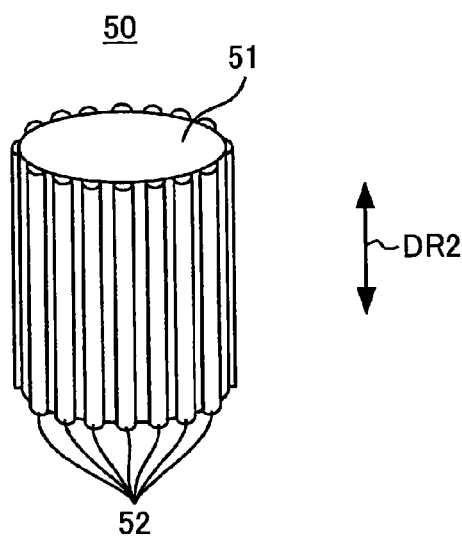
FIG. 2 is an oblique view diagram showing the construction of a stopper/inlet plug shown in FIG. 1.

FIG. 2 is an oblique view diagram showing the construction of the stopper/inlet plug 50 shown in FIG. 1. Referring to FIG. 2, the stopper/inlet plug 50 includes a plug 51 and projections 52. The plug 51 has a generally cylindrical form. Each of the projections 52 has a generally semi-circular cross-sectional shape and the projections 51 are formed on the outer peripheral surface of the plug 51 so as to extend in a length direction DR2.

Figure 3:
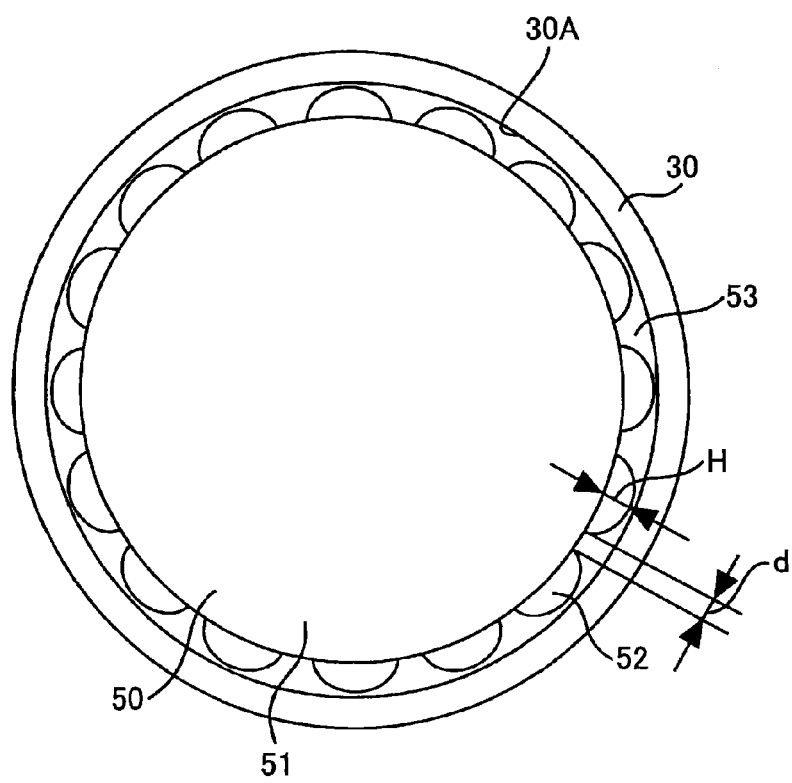
FIG. 3 is a plan view diagram showing the state of mounting the stopper/inlet plug to a conduit.

FIG. 3 is a plan view diagram showing the state of mounting the stopper/inlet plug 50 to the conduit 30. Referring to FIG. 3, the projections 52 are formed with plural number in the circumferential direction of the plug 51 with an interval d of several ten microns. Further, each projection 52 has a height H of several ten microns. The plural projections 52 of the stopper/inlet plug 50 make a contact with the inner wall surface 30A of the conduit 30. With this, the stopper/inlet plug 50 is in engagement with the inner wall of the conduit 30.

Because the projections 52 have a height H of several ten microns and are formed on the outer peripheral surface of the plug 51 with the interval d of several ten microns, there are formed plural gaps 53 between the stopper/inlet plug 50 and the inner wall 30A of the conduit 30 with a diameter of several ten microns in the state the stopper/inlet plug 50 is in engagement with the inner wall 30A of the conduit 30.

This gap 53 allows the nitrogen gas to pass in the length direction DR2 of the plug 51 and holds the metal melt 190 at the same time by the surface tension of the metal melt 190, and thus, the metal melt 190 is blocked from passing through the gap in the longitudinal direction DR2 of the plug 51.

Figure 4:
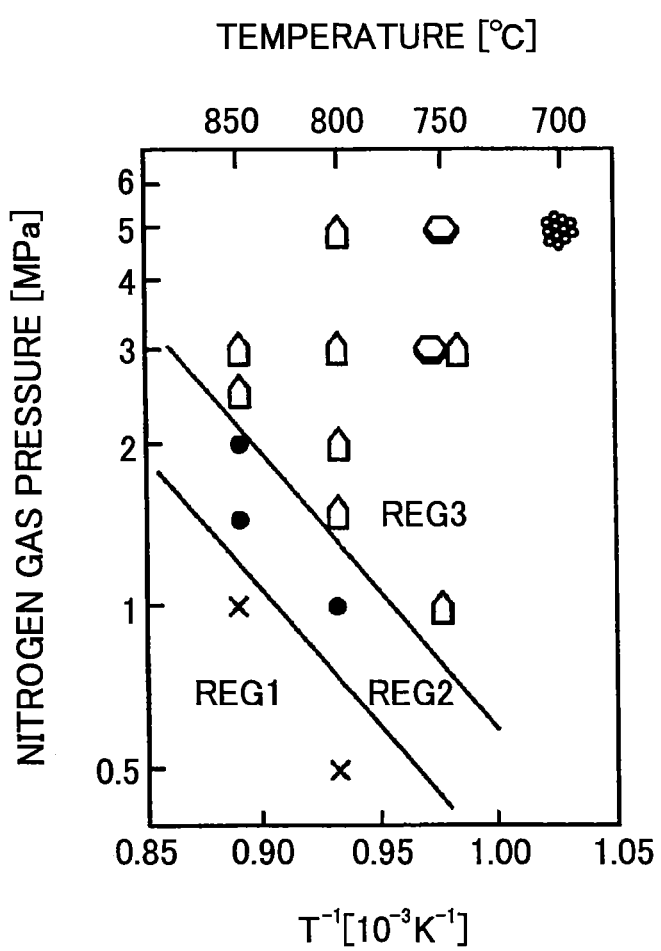
FIG. 4 is a schematic diagram showing the relationship between the nitrogen gas pressure and the crystal growth temperature for the case of growing a GaN crystal.

FIG. 4 is a schematic diagram showing the relationship between the nitrogen gas pressure and the crystal growth temperature for the case of growing a GaN crystal. In FIG. 4, the horizontal axis represents the crystal growth temperature while the vertical axis represents the nitrogen gas pressure. Referring to FIG. 4, a region REG1 represents the reaction where dissolving of the GaN crystal takes place, while a region REG2 represents the region where there occurs growth of a GaN crystal from a seed crystal while suppressing nucleation on the bottom surface and sidewall surface of the reaction vessel 10 in contact with the melt mixture 290. Further, a region REG3 represents the region where multiple nucleation takes place.

Thus, with the present invention, growth of the GaN crystal is made in the region REG2 where there occurs no new nucleation.

Figure 5:
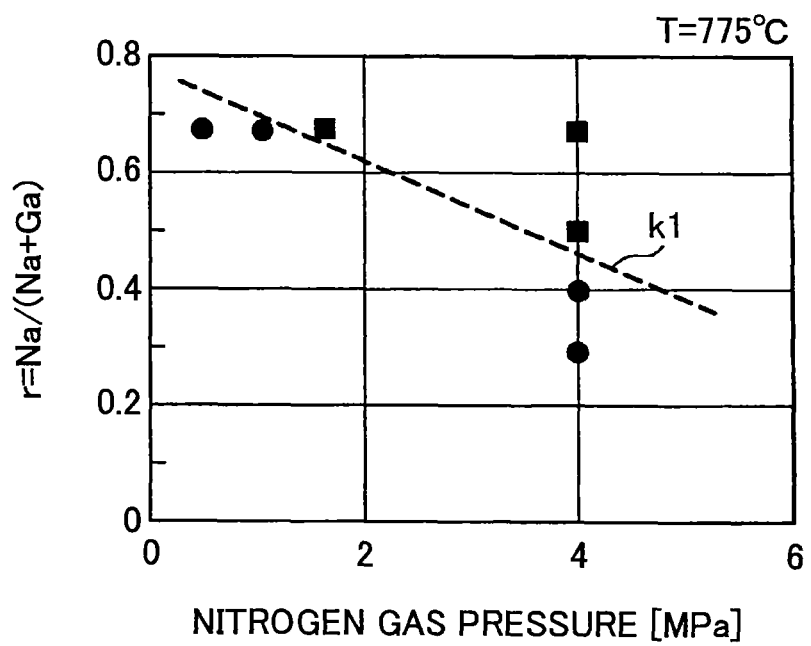
FIG. 5 is a diagram showing the relationship between the mole ratio of metal Na and metal Ga and the nitrogen gas pressure.

FIG. 5 is a diagram showing the relationship between the mole ratio of metal Na and metal Ga and the nitrogen gas pressure. In FIG. 5, the vertical axis represents a mole ratio r between the metal Na and the metal Ga, while the horizontal axis represents the nitrogen gas pressure. Here, it should be noted that the mole ratio r between the metal Na and the metal Ga is represented as Na/(Na+Ga). Further, FIG. 5 represents the relationship between the mole ratio r and the nitrogen gas pressure at the crystal growth temperature of 775° C.

Referring to FIG. 5, it should be noted that the region under the broken line k1 represents a crystal growth condition in the region REG2 shown in FIG. 4 in which there occurs formation of oblique facets in the GaN crystal. Further, the region above the broken line k1 represents the region in which there occurs multiple nucleation. Thus, the crystal growth condition that enables formation of the GaN crystal defined by the oblique facets is given such that the nitrogen gas pressure decreases relatively when the mole ratio r is increased relatively and the nitrogen gas pressure increases relatively when the mole ratio r is decreased relatively. It should be noted that the relationship between the mole ratio r and the nitrogen gas pressure shown in FIG. 5 is not limited to he crystal growth temperature of 775° C. but is obtained for the crystal growth temperature in the range of 720-830° C.

Further, it should be noted that a GaN crystal grown in the c axis direction (<0001>) is obtained when metal Li of predetermined amount is added in the crystal growth process conducted in the crystal growth condition under the broken line k1. In this case, the crystal growth condition that enables formation of a GaN crystal having a flat surface is given by Table 1.

TABLE 1

| | |
|---|---|
| Crystal growth temperature | 750-825° C. |
| Nitrogen gas pressure | 1-5 MPa |
| Ga amount | 2.5 g (35.9 mmol) |
| Na amount | 0.55 g (23.9 mmol) |
| Mol ratio r | 0.4 |
| Li amount | 2.2-3.2 mg (0.32-0.46 mmol) |

It should be noted that the amount of the metal Li shown in Table 1 corresponds to the concentration of 0.5-0.8 mol %. Thus, in the case the Li concentration in the melt mixture 290 is in the range of 0.5-0.8 mol %, a GaN crystal having a flat surface and grown in the c-axis direction is obtained.

Further, when the Li concentration in the melt mixture 290 is changed from crystal growth condition shown in Table 1 and increased to 1.0 mol % or more from the foregoing range of 0.5-0.8 mol %, there is caused multiple nucleation, while when the Li concentration in the melt mixture 290 is decreased from the foregoing range of 0.5-0.8 mol % to be smaller than 0.5 mol %, there is obtained a GaN crystal having a dimple surface.

Thus, with this invention, a GaN crystal of flat surface is grown by adding Li to the melt mixture of metal Ga and metal Na with the concentration of 0.5-0.8 mol %.

Figure 6:
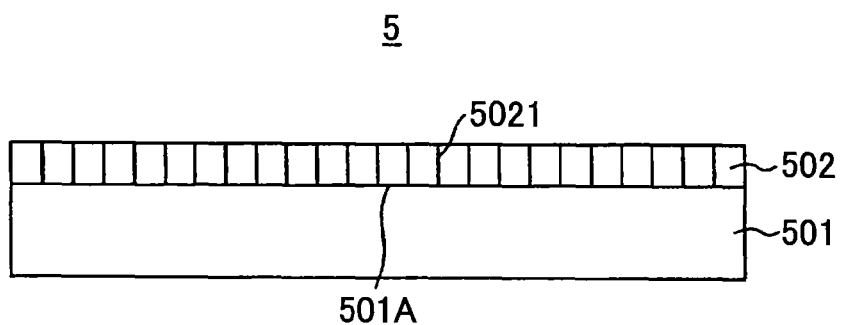
FIG. 6 is a schematic diagram showing the construction of a base body shown in FIG. 1.

FIG. 6 is a schematic diagram showing the construction of the base body 5 shown in FIG. 1. Referring to FIG. 6, the base body 5 comprises a sapphire substrate 501 and a GaN film 502. The GaN film 502 is formed on a principal surface 501A of the sapphire substrate 501 by a metal organic chemical vapor deposition (MOCVD) process. The GaN film 502 thus formed has threading dislocations 5021 with dislocation density in the range of $10^6$-$10^{10}$ cm$^{-2}$.

With this invention, a GaN crystal is grown on the base body 5 under the crystal growth condition that forms the oblique facets as described above (the region under the broken line k1 shown in FIG. 5) so as to growth the GaN crystal on the GaN film 502 shown in FIG. 6 with a dislocation density smaller than the dislocation density of the GaN film 502. Thereafter, a GaN crystal having a flat surface is grown under the crystal growth condition shown in Table 1.

FIGS. 7A-7F are diagrams showing the process steps for causing crystal growth of a GaN crystal having reduced dislocation density. Referring to the step of FIG. 7A, the base body 5 is manufactured by forming the GaN 502 on the sapphire substrate 501 by the MOCVD process.

Further, a GaN crystal is grown on the GaN film 502 of the base body 5 under the condition of forming the oblique facets (the region under the broken line k1 shown in FIG. 5). With this, a number of domains 510 of GaN crystal are formed on the GaN film 502 (see FIG. 7B).

Figure 7A:
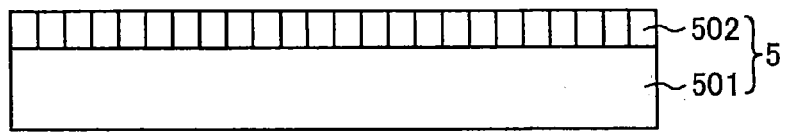
FIGS. 7A-7F are diagrams showing the process steps for causing crystal growth of a GaN crystal having reduced dislocation density.
Figure 7B:
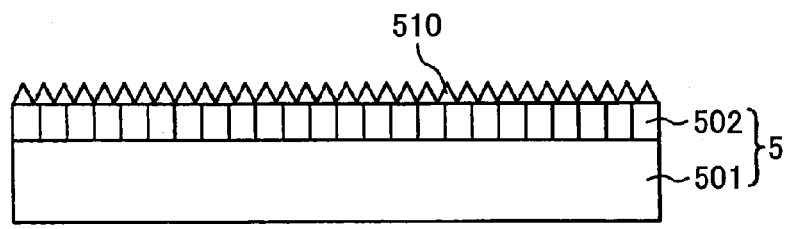
Figure 7C:
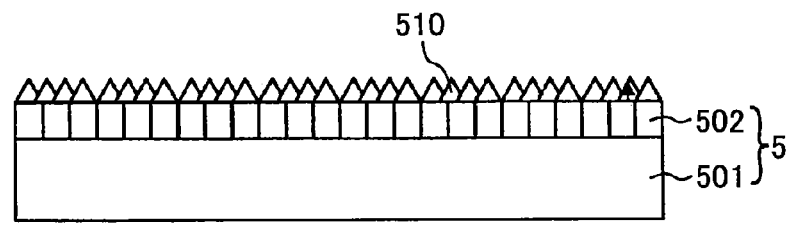
Figure 7D:
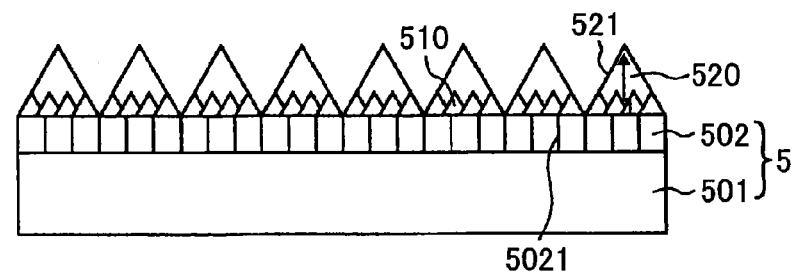
Figure 7E:
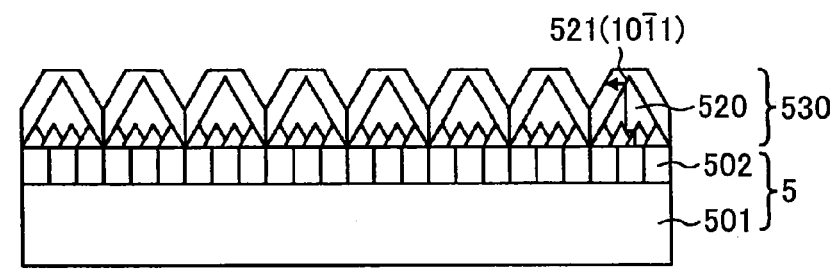
Figure 7F:
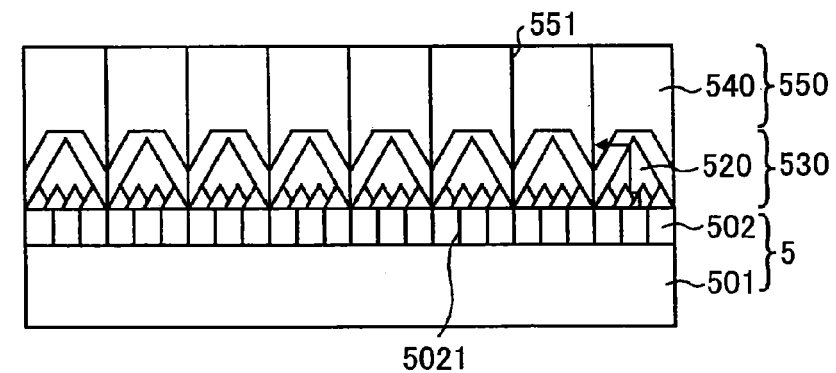

Further, with continuous growth of the GaN crystal is continued under the condition of forming the oblique facets (the region under the broken line k1 shown in FIG. 5), there occurs growth in the domains 510 (see FIG. 7C), while when the crystal growth of the GaN crystal proceeds further, the domains 510 merge with each other, and there are formed large domains 520 having oblique facets (see FIG. 7D).

With further growth of the domains 520, there is formed a GaN crystal 530 in the form of aggregate of the domains 520, wherein the threading dislocations 5021 formed in the GaN film 502 on the base body 5 invade into the domains 510 and further to the domains 520. There, the threading dislocations 5021 are deflected in the in-plane direction of the sapphire substrate 501 by the oblique facets 521 in the domains 520 and are accumulated in the region between adjacent domains 520 and 520 (see FIG. 7E).

Thereafter, crystal growth of the GaN crystal is conducted under the crystal growth condition shown in Table 1. With this, a GaN crystal 550 having a flat surface is obtained wherein the GaN crystal 550 thus obtained is formed of a domain 540 grown in the c-axis direction. The GaN crystal 550 has threading dislocations 551 formed between adjacent domains 540. In the GaN crystal 550, each domain 540 is characterized by low dislocation density (ideally no dislocations), and thus, the density of the threading dislocations 551 becomes lower than the density of the threading dislocations 5021 in the GaN film 502 (see FIG. 7F).

Thus, it becomes possible to manufacture the GaN crystal 550 having a dislocation density lower than that of the GaN film 502, by growing the GaN crystal 530 on the base body 5 under the condition where the oblique facets are formed, and subsequently growing a GaN crystal under the condition where the GaN crystal has a flat surface.

In this way, the GaN crystal 530 functions to deflect the threading dislocations of the GaN film 502 forming the base body 5 in the in-plane direction of the sapphire substrate 501. Further, it should be noted that the density of the threading dislocations 540 in the GaN crystal 550 is determined by the size of the domains 520 in the GaN crystal 530.

In more detail, the density of the threading dislocations 540 in the GaN crystal 550 is decreased relatively when the size of the domain 520 is increased relatively. Further, the density of the threading dislocations is increased relatively when the size of the domain 520 is decreased relatively.

This means that it is important to increase the size of the domains 520 for reducing the density of the threading dislocations 540. Thus, it becomes possible to manufacture the GaN crystal 550 having a dislocation density lower than that of the GaN film 502, by growing the GaN crystal 530 on the base body 5 under the condition where the oblique facets are formed, and subsequently growing a GaN crystal under the condition where the GaN crystal has a flat surface.

Incidentally, it should be noted that the oblique facets 521 has the surface orientation of (10-11), for example. It should be noted that this surface orientation (10-11) represents the surface orientation represented in FIG. 7E.

Figure 8:
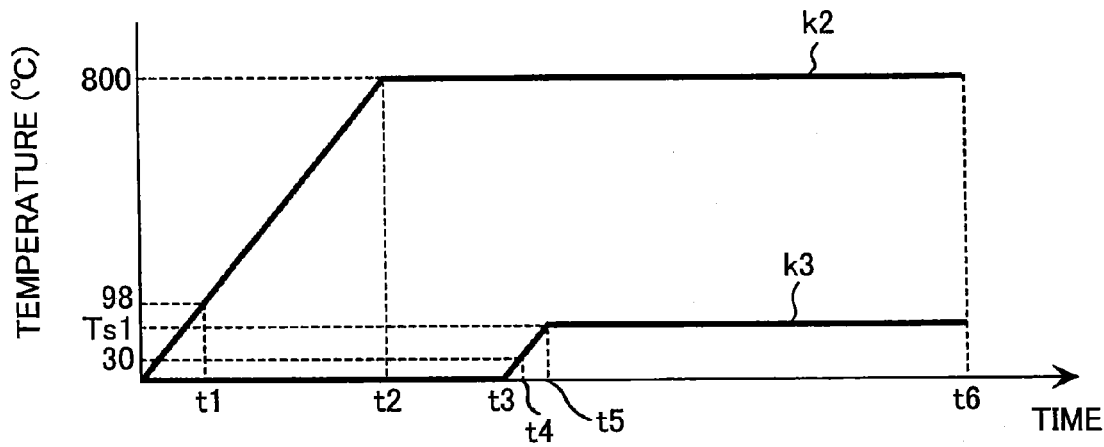
FIG. 8 is a timing chart of the temperature in the crystal growth apparatus shown in FIG. 1.

FIG. 8 is a timing chart of the temperature in the crystal growth apparatus 100 shown in FIG. 1.

Figure 9:
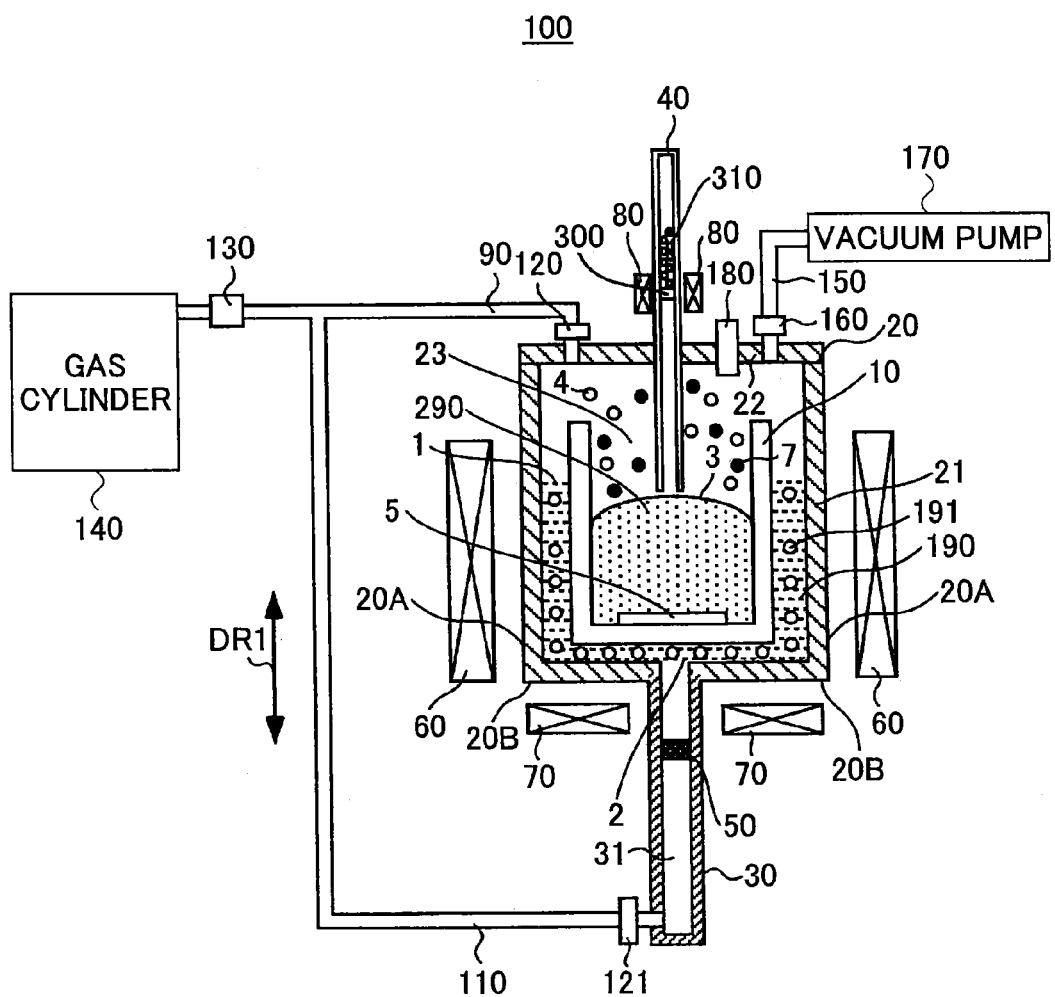
FIG. 9 is a schematic diagram showing the state inside the reaction vessel and the outer reaction vessel during the interval between two timings t1 and t2 shown in FIG. 8.
Figure 10:
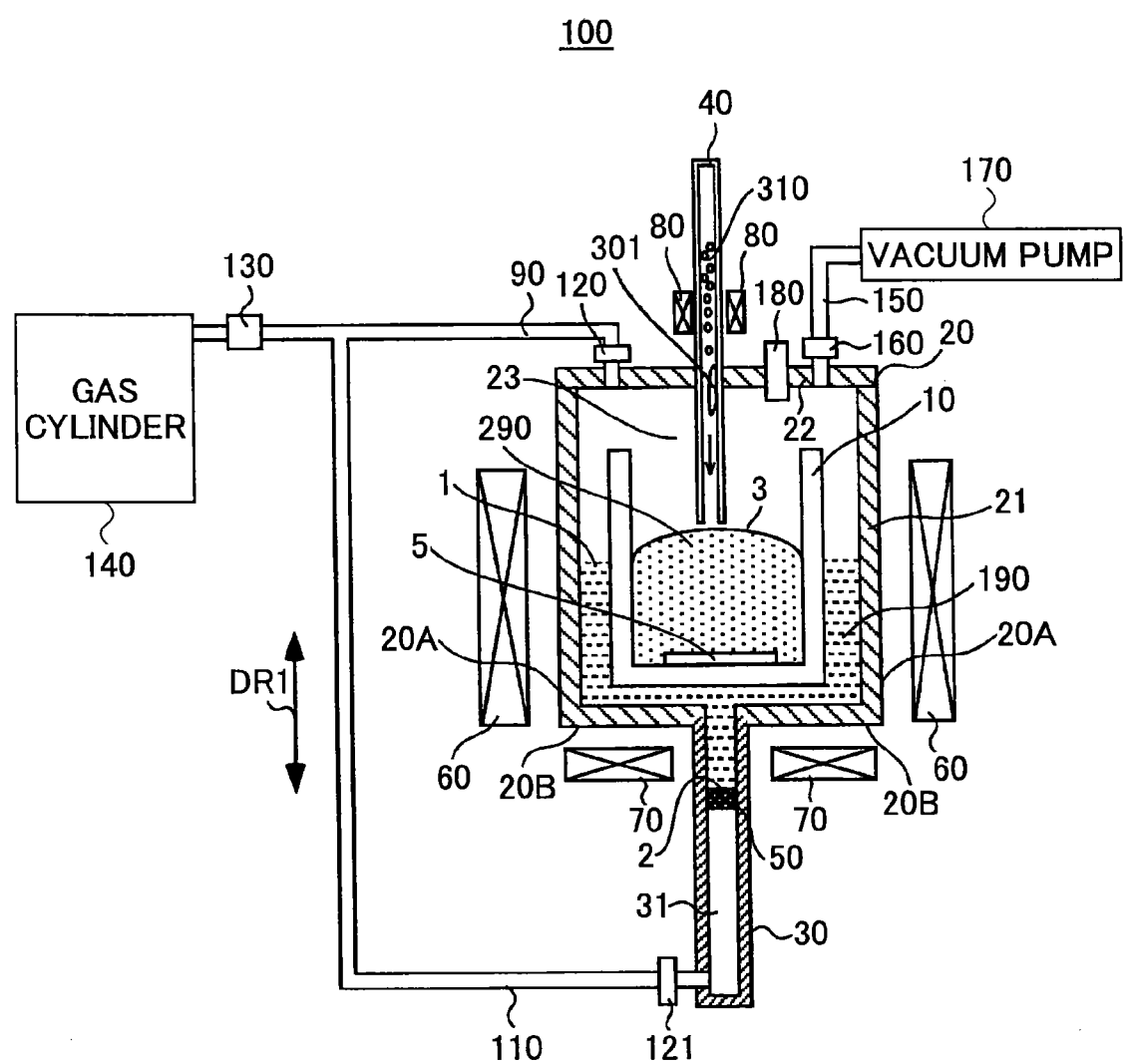
FIG. 10 is a schematic diagram showing the state inside the conduit during the interval between two timings t4 and t5 shown in FIG. 8.

Further, FIG. 9 is a schematic diagram showing the state inside the inner 10 and the outer reaction vessel 20 during the interval between two timings t1 and t2 shown in FIG. 8. Further, FIG. 10 is a schematic diagram showing the state inside the conduit 40 during the interval between two timings t4 and t5 shown in FIG. 8.

In FIG. 8, it should be noted that the curve k2 represents the temperature of the reaction vessel 10 and the outer reaction vessel 20 while the curve k3 represent the temperature of the conduit 40.

Referring to FIG. 8, the heating units 60 and 70 heat the reaction vessel 10 and the outer reaction vessel 20, such that the temperatures thereof rise along the line k1 and are held at 800° C. When the heating units 60 and 70 start to heat the reaction vessel 10 and the outer reaction vessel 20, the temperature of the reaction vessel 10 and the outer reaction vessel 20 start to rise and reach a temperature of 98° C. at the timing t1 and a temperate of 800° C. at the timing t2.

With this, the metal Na held between the reaction vessel 10 and the outer reaction vessel 20 undergoes melting and the metal melt 190 (=metal Na liquid) is formed. Further, the nitrogen gas 4 inside the space 23 cannot escape to the space 31 inside the conduit 30 through the metal melt 190 (=metal Na melt) and the stopper/inlet plug 50, and the nitrogen gas 4 is confined into the space 23. Reference should be made to FIG. 9.

Further, when the temperatures of the reaction vessel 10 and the outer reaction vessel 20 have reached 800° C., there occurs melting of the metal Na and metal Ga in the reaction vessel 10 and the melt mixture 290 is formed in the reaction vessel 10. Thereby, the nitrogen gas 4 in the space 23 is incorporated into the melt mixture 290 via the meditating metal Na in the melt mixture 290, and there occurs growth of the GaN crystal 530 on the GaN film 502 of the base body 5. Thereafter, the crystal growth of the GaN crystal 530 is continued during the interval from the timing t2 to the timing t3, wherein the heating unit 80 heats the part of the conduit 40 that holds the metal Ga 300 to the temperature Ts1.

Here, the temperature Ts1 is set to be higher than the melting temperature of metal Ga (30° C.) but lower than the melting temperature of metal Na (98° C.)

When the part of the conduit 40 holding the metal Ga 300 is heated to 30° C. or higher, the metal Ga 300 undergoes melting and a Ga melt 301 is formed as a result. The Ga melt 301 then enters to the melt mixture 290 along the inner wall of the conduit 40, and the metal Li 310 enters the melt mixture 290 by falling through the conduit 40 by gravity (see FIG. 10).

The metal Li thus entered into the melt mixture 290 undergoes dissolving into the melt mixture 290 held at 800° C. in view of the melting temperature of 180° C. for metal Li, and there occurs crystal growth of the GaN crystal 550 from the timing t5 to the timing t6.

Thus, the metal Li 310 is held in the conduit 40 with the weight of 2.2-3.2 mg as represented in Table 1. With this, the GaN crystal 550 is formed during the interval from the timing t5 to the timing t6 with flat surface, wherein the GaN crystal 550 thus formed is grown in the c-axis direction.

Further, because the GaN crystal 530 is grown during the interval from the timing t2 to the timing t3, Ga in the melt mixture 290 is decreased and the mole ratio r between Ga and Na increases beyond 0.4 with progress of time from the timing t2 to the timing t3. Thus, the weight of the metal Ga 300 that holds the metal Li 310 in the conduit 40 is set such that the mole ratio r of the melt mixture 290 becomes about 0.4 in the event the Ga melt 310 has entered into the melt mixture 290 after the timing t4.

Figure 11:
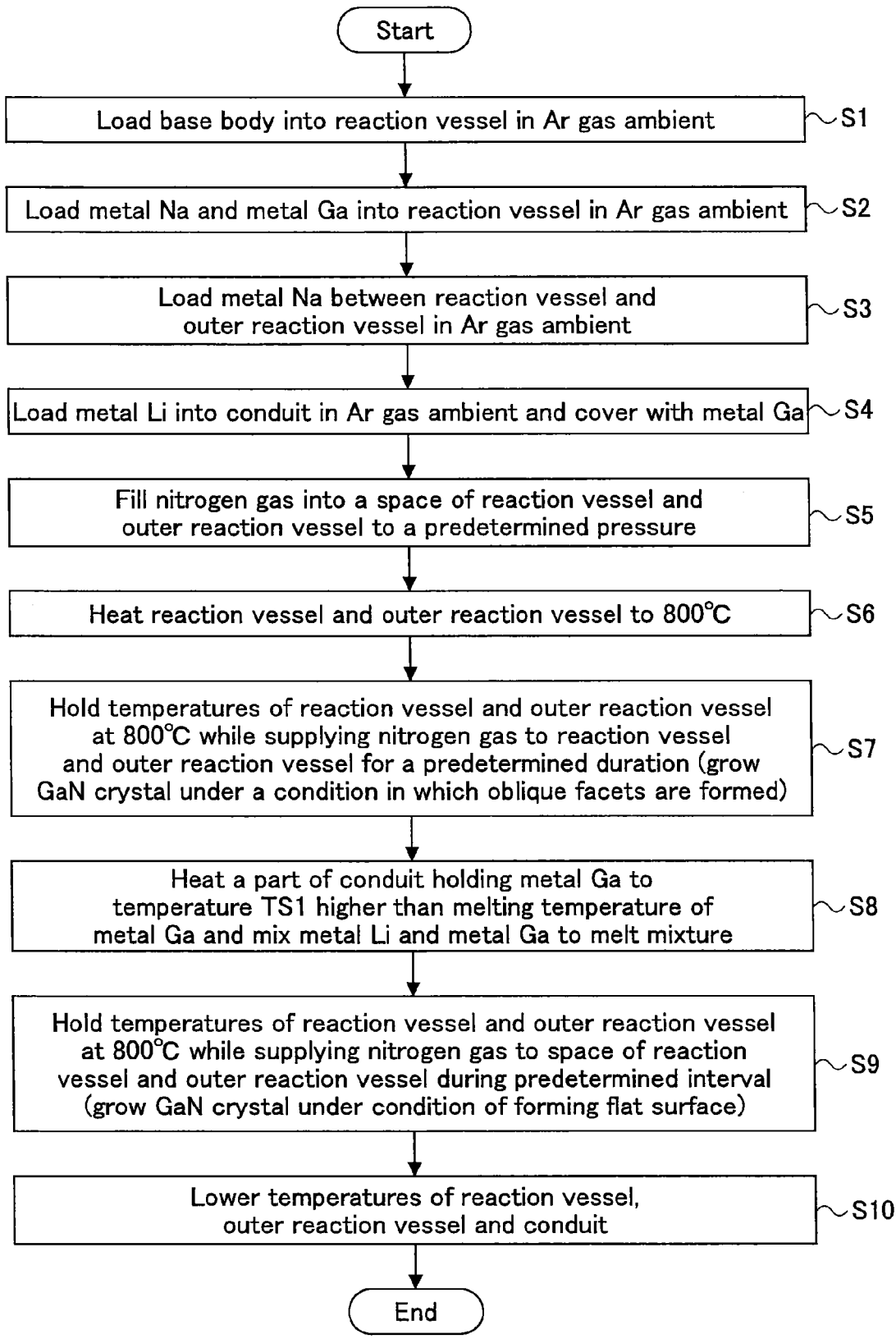
FIG. 11 is a flowchart explaining the manufacturing method of a GaN crystal according to Embodiment 13 of the present invention.

FIG. 11 is a flowchart explaining the manufacturing method of a GaN crystal according to Embodiment 1 of the present invention. Referring to FIG. 11, the reaction vessel 10 and the outer reaction vessel 20 are incorporated into a glove box filled with an Ar gas when a series of processes are started. Further, the base body 5 is loaded into the reaction vessel 10 in an Ar gas ambient (step S1), and the metal Na and metal Ga are loaded to the reaction vessel 10 in the Ar gas ambient (step S2). In this case, the metal Na and the metal Ga are loaded into the reaction vessel 10 such that the mole ratio r becomes 0.4. The Ar gas should be the one having a water content of 10 ppm or less and an oxygen content of 10 ppm or less (this applied throughout the present invention).

Thereafter, the metal Na is loaded between the reaction vessel 10 and the outer reaction vessel 20 in an Ar gas ambient (step S3), and the metal Li 310 of 2.2-3.2 mg is loaded into the conduit 40 in an Ar gas ambient. Thereafter, the metal Li 310 thus loaded is covered by the metal Ga 300 (step S4).

Next, the reaction vessel 10 and the outer reaction vessel 20 are set in the crystal growth apparatus 100 in the state that the reaction vessel 10 and the outer reaction vessel 20 are filled with the Ar gas.

Next, the valve 160 is opened and the Ar gas filled in the reaction vessel 10 and the outer reaction vessel 20 is evacuated by the vacuum pump 170. In this case, the Ar gas in the space of the conduit 40 in which the metal Li is held is evacuated through the gap between the metal Ga 300 and the conduit 40.

After evacuating the interior of the reaction vessel 10 and the outer reaction vessel 20 to a predetermined pressure (0.133 Pa or lower) by the vacuum pump 170, the valve 160 is closed and the valves 120 and 121 are opened. Thereby, the reaction vessel 10 and the outer reaction vessel 20 are filled with the nitrogen gas from the gas cylinder 140 via the gas supply lines 90 and 110. In this case, the nitrogen gas is supplied to the reaction vessel 10 and the outer reaction vessel 20 via the pressure regulator 130 such that the pressure inside the reaction vessel 10 and the outer reaction vessel 20 becomes about 0.1 MPa.

Further, when the pressure inside the outer reaction vessel 20 as detected by the pressure sensor 180 has reached about 0.1 MPa, the valves 120 and 121 are closed and the valve 160 is opened. With this the nitrogen gas filled in the reaction vessel 10 and the outer reaction vessel 20 is evacuated by the vacuum pump 170. In this case, too, the interior of the reaction vessel 10 and the outer reaction vessel 20 is evacuated to a predetermined pressure (0.133 Pa or less) by using the vacuum pump 170.

Further, this vacuum evacuation of the reaction vessel 10 and the outer reaction vessel 20 and filling of the nitrogen to the reaction vessel 10 and the outer reaction vessel 20 are repeated several times.

Thereafter, the interior of the reaction vessel 10 and the outer reaction vessel 20 is evacuated to a predetermined pressure by the vacuum pump 170, and the valve 160 is closed. Further, the valves 120 and 121 are opened and the nitrogen gas is filled into the reaction vessel 10 and the outer reaction vessel 20 by the pressure regulator 130 such that the pressure of the reaction vessel 10 and the outer reaction vessel 20 becomes the range of 1.01-5.05 MPa (step 5).

Because the metal Na held between the reaction vessel 10 and the outer reaction vessel 20 is solid in this state, the nitrogen gas is supplied to the space 23 inside the outer reaction vessel 20 also from the space 31 of the conduit 30 via the stopper/inlet plug 50. When the pressure of the space 23 as detected by the pressure sensor 180 has become 1.01-5.05 Pa, the valve 120 is closed.

Thereafter, the reaction vessel 10 and the outer reaction vessel 20 are heated to 800° C. by the heating units 60 and 70 (step S6). In this process of heating the reaction vessel 10 and the outer reaction vessel 20 to 800° C., the metal melt Na held between the reaction 10 and the outer reaction vessel 20 undergoes melting in view of the melting temperature of metal Na of about 98° C., and the metal melt 190 is formed. Thereby, two vapor-liquid interfaces 1001 and 1002 are formed. Reference should be made to FIG. 1. The vapor-liquid interface 1 is located at the interface between the metal melt 190 and the space 23 in the outer reaction vessel 20, while the vapor-liquid interface 2 is located at the interface between the metal melt 190 and the stopper/inlet plug 50.

At the moment the temperatures of the reaction vessel 10 and the outer reaction vessel 20 are elevated to 800° C., the temperature of the stopper/inlet plug 50 becomes 150° C.

This means that the vapor pressure of the metal melt 190 (=metal Na melt) at the vapor-liquid interface 2 is $7.6 \times 10^{-4}$ Pa, and thus, there is caused little evaporation of the metal melt 190 (=metal Na melt) through the gaps 53 of the stopper/inlet plug 50. As a result, there occurs little decrease of the metal melt 190 (=metal Na melt).

Further, even when the temperature of the stopper/inlet plug 50 is elevated to 300° C. or 400° C., the vapor pressure of the metal melt 190 (=metal Na melt) is only 1.8 Pa and 47.5 Pa, respectively, and decrease of the metal melt 190 (=metal Na melt) by evaporation is almost ignorable with such a vapor pressure.

Thus, with the crystal growth apparatus 100, the temperature of the stopper/inlet member 50 is set to a temperature such that there occurs little decrease of the metal melt 190 (=metal Na melt) by way of evaporation.

Further, during the step in which the inner reaction vessel 10 and the outer reaction vessel 20 are heated to 800° C., the metal Na and the metal Ga inside the reaction vessel 10 become a liquid, and the melt mixture 290 of metal Na and metal Ga is formed in the reaction vessel 10.

Further, when the temperatures of the reaction vessel 10 and the outer reaction vessel 20 are elevated to 800° C., the nitrogen gas in the space 23 is incorporated into the melt mixture 290 via the mediating metal Na, and there starts the growth of GaN crystal 530 on the GaN film 502 of the base body 5 under the condition in which the oblique facets are formed.

Thereafter, the temperatures of the reaction vessel 10 and the outer reaction vessel 20 are held at 800° C. during a predetermined interval (from timing t2 to timing t3), and there proceeds crystal growth of the GaN crystal 530 under the condition where the oblique facets are formed. Thus, with progress of crystal growth of the GaN crystal 530, the nitrogen gas in the space 23 is consumed and there is caused a decrease of the nitrogen gas in the space 23. Then the pressure P1 of the space 23 becomes lower than the pressure P2 of the space 30 inside the conduit 31 (P1<P2), and there is formed a differential pressure between the space 23 and the space 31. Thus, the nitrogen gas in the space 31 is supplied to the space 23 consecutively via the stopper/inlet plug 50 and the metal melt 190 (=metal Na melt).

Thus, the temperatures of the reaction vessel 10 and the outer reaction vessel 20 are held at 800° C. for a predetermined duration while supplying the nitrogen gas to the reaction vessel 10 and the space 23 of the outer reaction vessel 20. With this, the GaN crystal 530 is grown under the condition in which there are formed oblique facets.

At the timing t3, the heating unit 80 heats the part of the conduit 40 holding the metal Ga 300 to the temperature Ts1, and the Ga melt 301 and the metal Li 310 are loaded into the melt mixture 290 (step S8).

Thereafter, the temperatures of the reaction vessel 10 and the outer reaction vessel 20 are held at 800° C. for a predetermined duration (from timing t5 to timing t6) while supplying the nitrogen gas to the reaction vessel 10 and the space 23 of the outer reaction vessel 20 (step S9). With this, growth of the GaN crystal 550 takes place with flat surface.

Thereafter, the temperatures of the reaction vessel 10, the outer reaction vessel 20 and the conduit 40 are lowered (step S10), and manufacture of the GaN crystal is completed.

As explained heretofore, the manufacturing method of the GaN crystal of the present invention has the feature of growing the GaN crystal 530 on the base body 5 under the condition that there are formed oblique facets on the GaN crystal 530 (reference should be made to the step S7). Thereafter, the GaN crystal 550 is grown on the base body 5 under the condition that a flat surface is obtained (see the step S9).

As a result of this feature, the threading dislocations originating from the threading dislocations 5021 in the GaN film 502 formed on the base body 5 are deflected in the in-plane direction of the sapphire substrate 501 by the oblique facets 521 of the GaN crystal 530, and it becomes possible to manufacture the GaN crystal 550 with reduced threading dislocation density. In the present case, it is possible to reduce the density of the threading dislocations in the GaN crystal 550 to about $10^4$ cm$^{-2}$.

Further, it should be noted that the GaN crystals 530 and 550 grown according to the flowchart shown in FIG. 11 contain Na, and the GaN crystal contains Li with the concentration of $10^{15}$-$10^{21}$ cm$^{-3}$.

Further, the manufacturing method of GaN crystal of the present invention has the feature of growing the GaN crystal in the state in which the metal Na vapor 7 is confined in the space 23 (see FIG. 9). As a result of this feature, evaporation of metal Na from the melt mixture 290 is suppressed, and it becomes possible to maintain the crystal growth rate of the GaN crystal by incorporating the nitrogen gas 4 in the space 23 into the melt mixture 290.

In the steps S7 and S9 shown in FIG. 11, it should be noted that the temperatures of the reaction vessel 10 and the outer reaction vessel 20 are held at 800° C. in the interval from the timing t2 to the timing t6, and the growth of the GaN crystal 530 is in progress on the base body 5. Further, with progress of growth of the GaN crystal 530, there occurs evaporation of metal Na from the metal melt 190 and the melt mixture 290, and thus, there exist a mixture of the nitrogen gas 4 and the metal Na vapor 7 in the space 23 (see FIG. 9).

Further, with consumption of the nitrogen gas 4, the pressure P1 of the space 23 is lowered than the pressure P2 of the space 31 inside the conduit 30. Then the nitrogen gas is supplied from the space 31 of the conduit 30 to the metal melt 190 via the stopper/inlet plug 50, wherein the nitrogen gas is moved through the metal melt 190 in the form of bubbles 191. Thus, the nitrogen gas is supplied to the space 23 through the vapor-liquid interface 1 (see FIG. 9).

Now, when the pressure P1 of the space 23 becomes generally equal to the pressure P2 inside the space 31, the supply of the nitrogen gas from the space 30 of the conduit 31 to the reaction vessel 50 and the outer reaction vessel 10 via the stopper/inlet plug 20 and the metal melt 190 is stopped.

Thus, the stopper/inlet plug 50 holds the metal melt 190 (=metal Na melt) between the reaction vessel 10 and the outer reaction vessel 20 and also inside the conduit 30 by the surface tension of the metal melt 190 and further supplies the nitrogen gas from the space 31 to the reaction vessel 10 and the outer reaction vessel 20. Thus, the stopper/inlet plug 50 is formed of a structure that blocks passage of the metal melt 190 therethrough.

While it has been explained in the foregoing that the manufacturing of the GaN crystal 530 of reduced threading dislocations is made on the base body 5, which in turn comprises the sapphire substrate 501 and the GaN film 502 formed on the sapphire substrate 501 by an MOCVD process, the present invention is not limited to such a specific example and it is also possible to use a seed crystal of a GaN crystal for the base body 5.

Figure 12A:
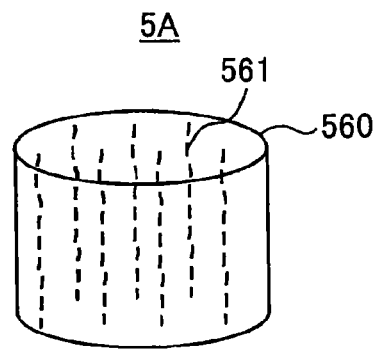
FIGS. 12A and 12B are schematic diagrams showing another example of the base body.
Figure 12B:
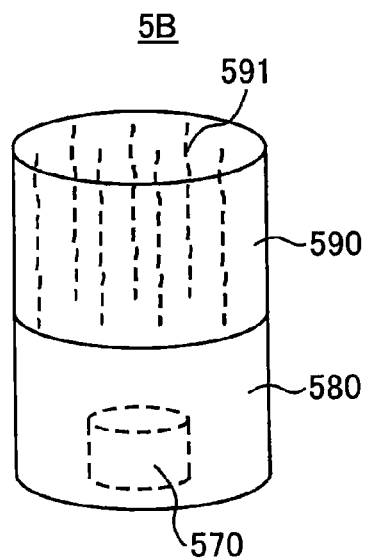

FIGS. 12A and 12B are schematic diagrams showing other examples of the base body 5. Thus, the base body 5 may be formed of a base body 5A shown in FIG. 12A or a base body 5B shown in FIG. 12B.

Referring to FIG. 12A, the base body 5A comprises a seed crystal 560 of a columnar shape. The seed crystal 560 contains threading dislocations 561.

In the region REG3 shown in FIG. 4, there are caused numerous nucleation on the sidewall surface and bottom surface of the reaction vessel 10 that make contact with the melt mixture 290. Further, the nuclei thus formed have a columnar shape grown in the c-axis direction. Thus, a large number of GaN crystals are grown with the crystal growth apparatus 100 under the crystal growth condition corresponding to the recon R%EG3 shown in FIG. 4. Thus, one GaN is picked up from the numerous GaN crystals thus grown and is used for the seed crystal 560.

In the case of growing a GaN in the region REG3 shown in FIG. 4, it should be noted that the mole ratio r between the metal Na and the metal Ga is set to 5:5, for example.

Referring to FIG. 12B, the base body 5B comprises a seed crystal 570 and GaN crystal s 580 and 590. The seed crystal 570 is manufactured under the crystal growth condition corresponding to the region REG3 shown in FIG. 4 and is formed of a dislocation-free GaN crystal. It should be noted that the GaN crystal 580 is grown from the seed crystal 570 under the crystal growth condition corresponding to the region REG2 shown in FIG. 4 and is dislocation-free. The GaN crystal 590 is grown in continuation to the GaN crystal 580 under the crystal growth condition corresponding to the region REG2 shown in FIG. 4 and contains dislocations 591.

Thus, the base body 5B is manufactured by growing a GaN crystal from the seed crystal 570 under the crystal growth condition of the region REG2 shown in FIG. 4. Thereby, there occurs crystal growth of dislocation-free GaN crystal 580 at first, and growth of the GaN crystal containing therein dislocations 590 takes place subsequently.

Thus, FIG. 12A shows the case in which the seed crystal 560 grown under the crystal growth condition corresponding to the region REG3 shown in FIG. 4 contains itself the threading dislocations 561, while FIG. 12B shows the case in which the GaN crystal grown from the seed crystal 570 manufactured by using the crystal growth condition corresponding to the region REG3 shown in FIG. 4 contains the dislocations 591.

In any of the cases of using the base body 5A or base body 5B, the GaN crystal 550 grown according to the flowchart shown in FIG. 11 has reduced threading dislocations. In this case, the base body 5A or 5B is disposed at the bottom surface of the reaction vessel 10 in the step S1.

Thus, in any of the cases of using the base body 5A or 5B of GaN crystal, it is possible to manufacture the GaN crystal 550 with reduced threading dislocations.

Figure 13:
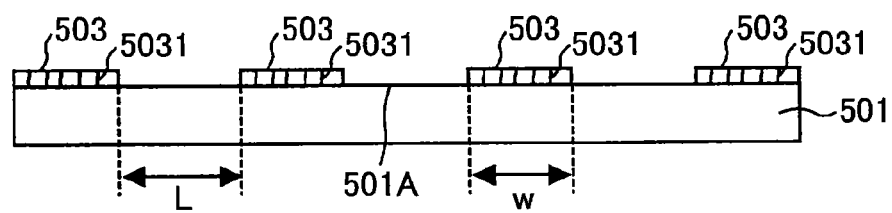
FIG. 13 is a schematic diagram showing further example of the base body.

FIG. 13 is a schematic diagram showing another example of base body 5. Thus, the base body 5 may be formed of a base body 5C shown in FIG. 13. Referring to FIG. 13, the base body 5C comprises the sapphire substrate 501 and plural GaN films 503. The plural GaN films 503 are manufactured by etching the GaN film 502 formed according to an MOCVD process (see FIG. 6) with a predetermined width W and a predetermined interval L. Thus, each GaN film 503 comprises a stripe-form crystal having the width W. Further, each of the plural GaN crystals 503 has threading dislocations 5031. The predetermined width W may be set to 100 μm, for example, while the predetermined interval L may be set to 300 μm, for example.

Figure 14A:
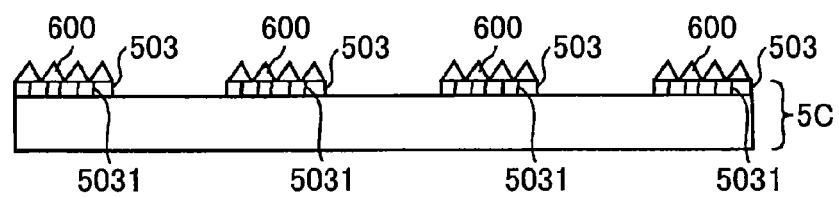
FIGS. 14A-14C are diagrams showing the steps for causing crystal growth of a GaN crystal of reduced threading dislocations on the base body shown in FIG. 13.
Figure 14B:
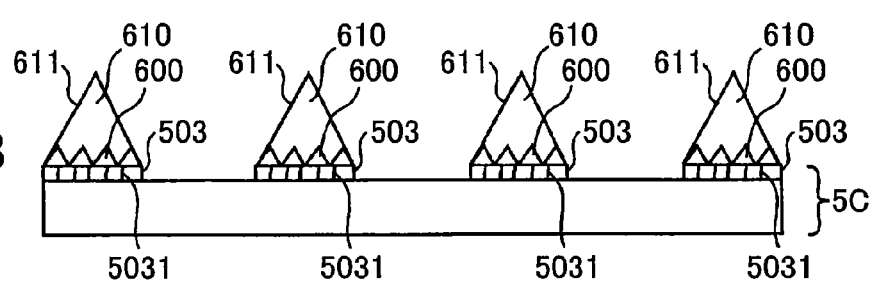
Figure 14C:
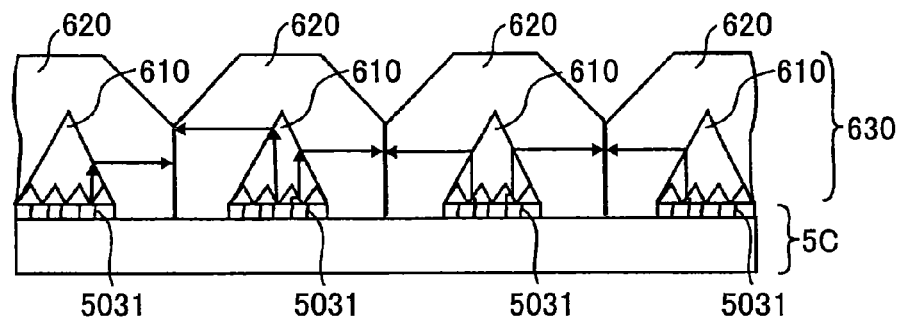

FIGS. 14A-14C are diagrams showing the steps for causing crystal growth of a GaN crystal of reduced threading dislocations on the base body shown in FIG. 13. Referring to FIG. 14A, a GaN crystal is grown on the GaN film 502 of the base body 5C under the condition of forming the oblique facets (the region under the broken line k1 shown in FIG. 5). With this, a number of domains 600 of GaN crystal are formed on the plural GaN films 503 of the base body 5C (see FIG. 14A).

Further, with continuous growth of the GaN crystal is continued under the condition of forming the oblique facets (the region under the broken line k1 shown in FIG. 5), there occurs growth in the domains 600 (see FIG. 7C), while when the crystal growth of the GaN crystal proceeds further, the domains 600 merge with each other, and there are formed large domains 610 having oblique facets 611 (see FIG. 14B).

With further growth of the domains 610, there is formed a GaN crystal 630 in the form of aggregate of the domains 620, wherein the threading dislocations 5031 formed in the GaN film 503 on the base body 5C invade into the domains 600 and further to the domains 610. There, the threading dislocations 5031 are deflected in the in-plane direction of the sapphire substrate 501 by the oblique facets 611 in the domains 610 and are accumulated in the region between adjacent domains 620 and 620 (see FIG. 14C).

Thereafter, crystal growth of the GaN crystal is conducted under the crystal growth condition shown in Table 1. With this, a GaN crystal of flat surface is obtained from the domains grown in the c-axis direction similarly to the GaN crystal 550 shown in FIG. 7E.

As a result, it becomes possible to manufacture a GaN crystal with reduced threading dislocations.

In the case of using the base body 5C, the domains 600 are not formed on the part of the base body 5C where the sapphire substrate 501 is exposed, and thus, it becomes possible to increase the size of the domains 620 as compared with the case of using the base body 5.

Thus, it is possible with the present embodiment to decrease the threading dislocations in the GaN crystal grown on the domains 620 as compared with the case of using the base body 5. Further, it becomes possible to increase the size of the GaN crystal grown on the domains 620 further as compared with the case of using the base body 5, and it becomes possible to manufacture a device by using a dislocation-free GaN crystal.

In the case of using the base body 5C, the interval L of the GaN films 503 having the threading dislocations 5031 is determined according to he size of the semiconductor device that is manufactured by using the GaN crystal 550 of flat surface. In the case of manufacturing a semiconductor device by using the GaN crystal 550, the semiconductor device is formed in the domain 540 where there is no threading dislocation. Further, the size of the domains 540 free from threading dislocations is determined in the GaN crystal 550 grown on the GaN crystal 630, which in turn is formed of aggregate of the domains 620, according to the interval L. Thus, the interval L is determined according to the size of the semiconductor device to be manufactured by using the GaN crystal 550.

With the present embodiment, it is also possible to use the sapphire substrate 501 for the base body by removing the GaN crystal 502 from the base body 5.

Further, with the present invention, it is possible to manufacture the base body 5 by using ScAlMgO in place of the sapphire substrate 501 of the base body 5.

Further, it is possible to use a SiC crystal for the base body in place of the base body 5.

In the case of growing the GaN crystal of reduced threading dislocations by using the crystal growth apparatus 100, it is also possible to grow the GaN crystal of reduced threading dislocations as follows.

Thus, with the crystal growth apparatus 100, the temperature T1, which is the temperature of the vapor-liquid interface 1 between the space 23 inside the outer reaction vessel 20 and the metal liquid 190 or the temperature near the vapor-liquid interface 1, and the temperature T2, which is the temperature of the vapor-liquid interface 3 between the space 23 and the melt mixture 290 or the temperature near the vapor-liquid interface 3, are set to the respective temperatures such that the vapor pressure of the metal Na evaporated from the metal melt 190 is generally identical with the vapor pressure of the metal Na evaporated from the melt mixture 290.

When these two temperatures are identical, the vapor pressure of the metal Na evaporated from the metal melt 190 becomes higher than the vapor pressure of the metal Na evaporated from the melt mixture 290, and thus, the temperature T1 is set to be lower than the temperature T2 such that the vapor pressure of the metal Na evaporated from the metal melt 190 becomes generally identical with the vapor pressure of the metal Na evaporated from the melt mixture 290.

As a result, migration of the metal Na from the metal melt 190 to the melt mixture 290 balances with migration of the metal Na from the melt mixture 290 to the metal melt 190, and it becomes possible to suppress the change of molar ratio of the metal Na and the metal Ga in the melt mixture 290 caused by the migration of the metal Na from the metal melt 190 to the melt mixture 290 or from the melt mixture 290 to the metal melt 190. Thereby, it becomes possible to manufacture a GaN crystal of large size stably.

Further, while it has been explained that the height H of the projections 52 of the stopper/inlet plug 50 and the separation d between the projections 52 are explained as several ten microns, it is possible that the height H of the projections 52 and the separation d between the projections 52 may be determined by the temperature of the stopper/inlet plug 50. More specifically, when the temperature of the stopper/inlet plug 50 is relatively high, the height H of the projections 52 is set relatively higher and the separation d between the projections 52 is set relatively smaller. Further, when the temperature of the stopper/inlet plug 50 is relatively low, the height H of the projection 52 is set relatively lower and the separation d between the projections 52 is set relatively larger. Thus, in the case the temperature of the stopper/inlet plug 50 is relatively high, the size of the gap 53 between the stopper/inlet plug 50 and the conduit 30 is set relatively small, while in the case the temperature of the stopper/inlet plug 50 is relatively high, the size of the gap 53 between the stopper/inlet plug 50 and the conduit 30 is set relatively larger.

It should be noted that the size of the cap 52 is determined by the height H of the projections 52 and the separation d between the plural projections 52, while the size of the gap 53 capable of holding the metal melt 190 by the surface tension changes depending on the temperature of the stopper/inlet plug 50. Thus, the height H of the projections 52 and the separation d between the projections 52 are changed depending on the temperature of the stopper/inlet plug 50. With this, the metal melt 190 is held reliably by the surface tension.

The temperature control of the stopper/inlet valve 50 is achieved by the heating unit 70. Thus, when the stopper/inlet plug 50 is to be heated to a temperature higher than 150° C., the stopper/inlet plug 50 is heated by the heating unit 70.

While it has bee explained in the foregoing that the GaN crystal 530 deflects the threading dislocations 5021 of the GaN film 502 in the in-plane direction of the sapphire substrate 501, the present invention is not limited to such a specific construction and any construction may be used in general as long as it is capable of deflecting the threading dislocations 5021 of the GaN film 502 in the direction different from the direction of crystal growth from the base body 5.

Further, while explanation has been made that the GaN crystal 530 has a (10-11) surface, the present invention is not limited to such a specific case, and the GaN crystal 530 may generally have a crystal growth surface other than the surface parallel to the c surface and the surface parallel to the c-axis.

Further, while explanation has been made that the GaN crystal 550 is formed of a GaN crystal grown in the c-axis direction, the present invention is not limited to such a specific construction, and it is generally sufficient that the GaN crystal 550 has a crystal growth surface generally perpendicular to the direction of crystal growth of the GaN crystal 530.

Further, it is sufficient that at least a part of the GaN crystal 530 makes contact with the base body 5, 5A, 5B, or 5C. When at least a part of the GaN crystal 530 is in contact with the base body 5, 5A, 5B, or 5C, it becomes possible to deflect the direction of the threading dislocations from the base body 5, 5A, 5B and 5C.

Further, while explanation has been made that the base body 5C contains the plural GaN crystals 503 of stripe shape formed on the sapphire substrate 501, the base body 5C of the present invention may contain plural GaN crystal islands formed on the sapphire substrate 501. In this case, the plural GaN crystal islands are formed on the sapphire substrate 501 with a predetermined interval determined according to the size of the device manufactured by using the GaN crystal 550.

Further, while explanation has been made that the conduit 40 holds the metal Li 310, the present invention is not limited to such a construction and it is also possible that the conduit 40 holds line in place of the metal Li 310.

Further, the GaN crystal 530 grown under the condition of forming the oblique facets constitute a "first group III nitride crystal", while the GaN crystal 550 having a flat surface constitutes a "second group III nitride crystal".

Further, the GaN crystal 630 grown under the condition where the oblique facets are formed constitutes the "first group III nitride crystal".

Further, the GaN films 502 and 503 constitute the "third group III nitride crystal".

Further, the plural GaN films 503 constitute "plural stripe crystals".

Further, the seed crystal 560 or the GaN crystal 590 constitutes a "low-grade seed crystal".

[Embodiment 2]

Figure 15:
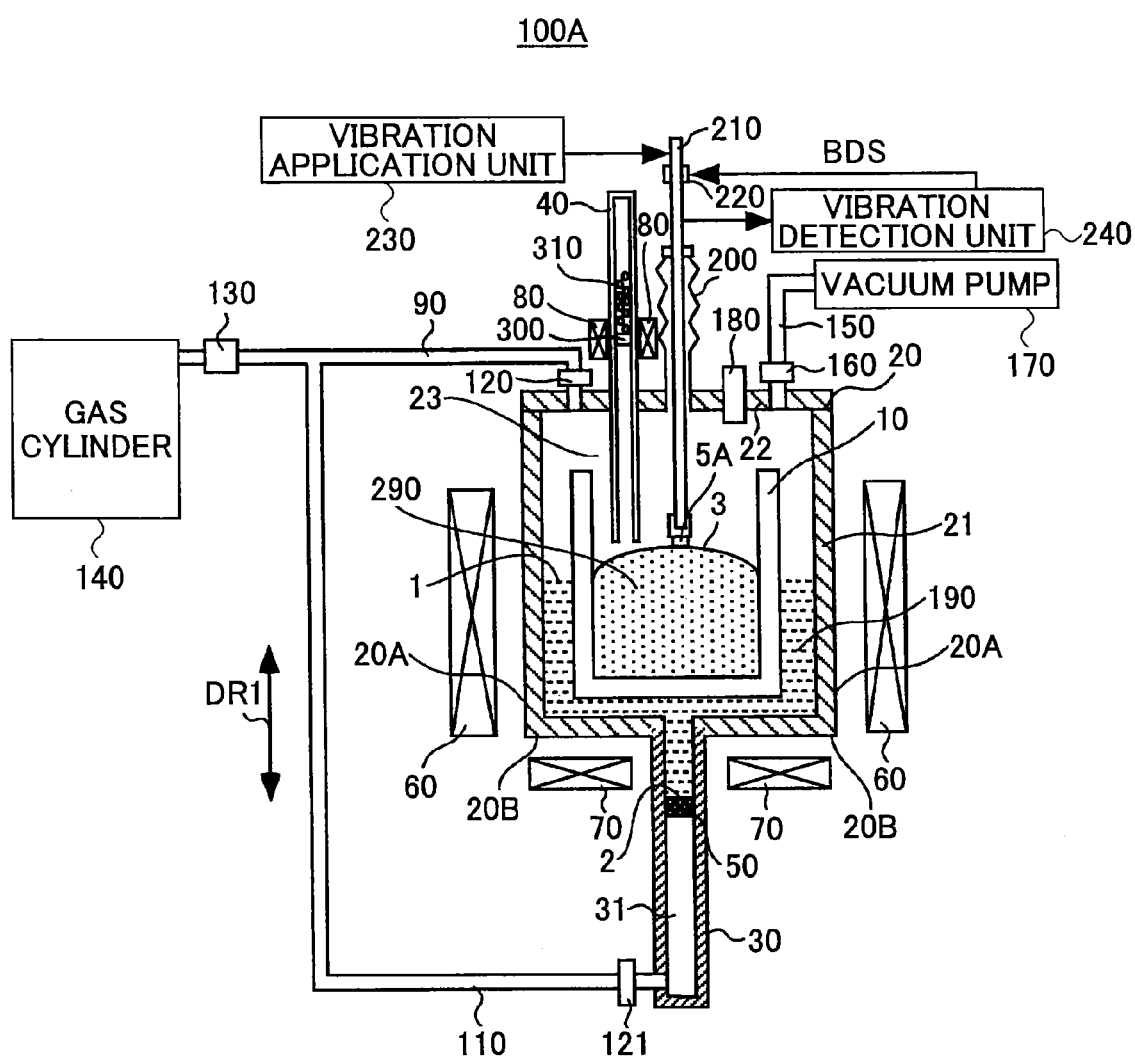
FIG. 15 is a schematic cross-sectional diagram showing a crystal growth apparatus according to Embodiment 2 of the present invention.

FIG. 15 is a schematic cross-sectional diagram showing a crystal growth apparatus according to Embodiment 2 of the present invention. Referring to FIG. 15, a crystal growth apparatus 100A has a construction generally identical with the construction of the crystal growth apparatus 100, except that a bellows 200, support unit 210, an up/down mechanism 220, a vibration application unit 230, and a vibration detection unit 240 are added to the crystal growth apparatus 100 shown in FIG. 1.

The bellows 200 is connected to the outer reaction vessel 20 at a location above the reaction vessel 10 in terms of the gravitational direction DR1. The support unit 210 comprises a cylindrical member and a part thereof is inserted into the space 23 inside the outer reaction vessel 20 via the bellows 200. The up/down mechanism 220 is mounted upon the support unit 210 at the location above the bellows 200.

The bellows 200 holds the support unit 210 and disconnects the interior of the outer reaction vessel 20 from outside. Further, the bellows 200 is capable of expanding and contracting in the gravitational direction DR1 with movement of the support unit 210 in the gravitational direction DR1. The support unit 210 supports a base body 5A of a GaN crystal at a first end thereof inserted into outer the reaction vessel 2.

The up/down mechanism 220 causes the support unit 210 to move up and down in response to a vibration detection signal BDS from the vibration detection unit 240 according to a method to be explained later, such that the base body 5A makes a contact with a vapor-liquid interface 3 between the space 23 and the melt mixture 290.

The vibration application unit 230 comprises a piezoelectric element, for example, and applies a vibration of predetermined frequency to the support unit 210. The vibration detection unit 240 comprises an acceleration pickup, for example, and detects the vibration of the support unit 210 and outputs the vibration detection signal BDS indicative of the vibration of the support unit 210 to the up/down mechanism 220.

Figure 16A:
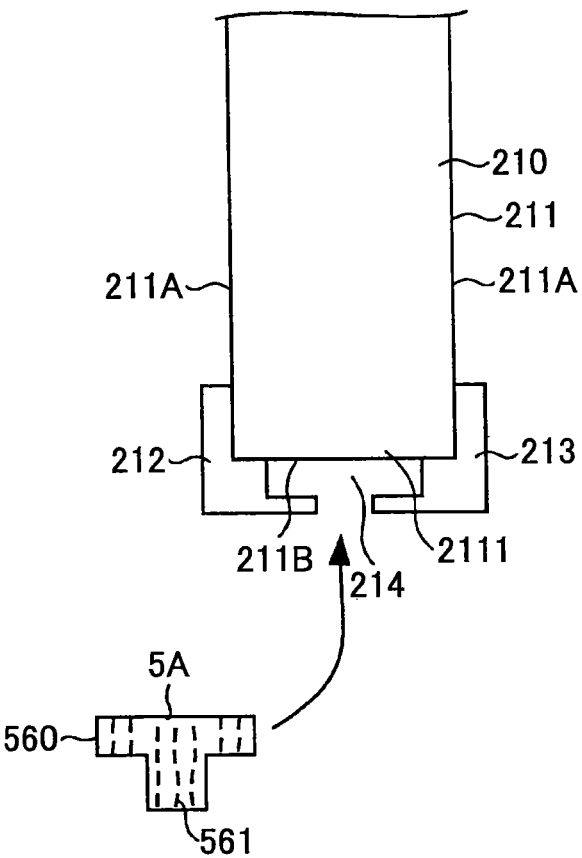
FIGS. 16A and 16B are diagrams showing a support unit shown in FIG. 15 in an enlarged scale.

FIG. 16 is an enlarged diagram showing the construction of the support unit shown in FIG. 15. Referring to FIG. 16, the support unit 210 includes a cylindrical member 211 and fixing members 212 and 213. The cylindrical member 211 has a generally circular cross-sectional form. The fixing member 212 has a generally L-shaped cross-sectional form and is fixed upon an outer peripheral surface 211A and a bottom surface 211B of the cylindrical member 211 at the side of a first end 2111 of the cylindrical member 211. Further, the fixing member 213 has a generally L-shaped cross-sectional form and is fixed upon the outer peripheral surface 211A and the bottom surface 211B of the cylindrical member 211 at the side of a first end 2111 of the cylindrical member 211 in symmetry with the fixing member 212. As a result, there is formed a space part 214 in the region surrounded by the cylindrical member 211 and the fixing members 212 and 213 (see FIG. 16A).

Figure 16B:
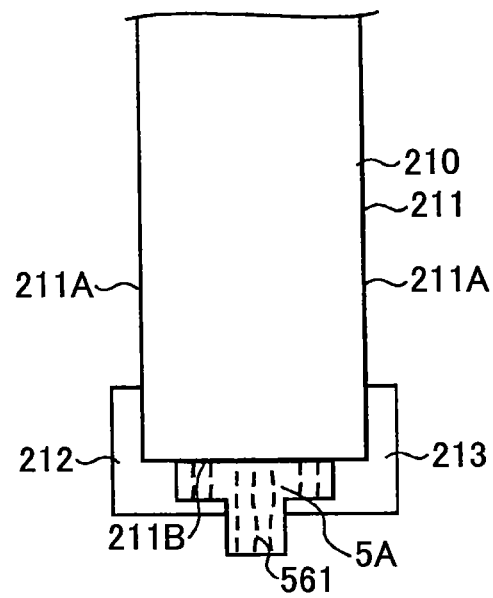

The base body 5A comprises a seed crystal 560 containing therein threading dislocations 561, while the seed crystal 560 has a shape fitting the space 214. Further, the base body 5A is supported by the support unit 210 by being engaged with the space 214. In the present case, the base body 5A makes a contact with the bottom surface 211B of the cylindrical member 211. Reference should be made to FIG. 16B.

Figure 17:
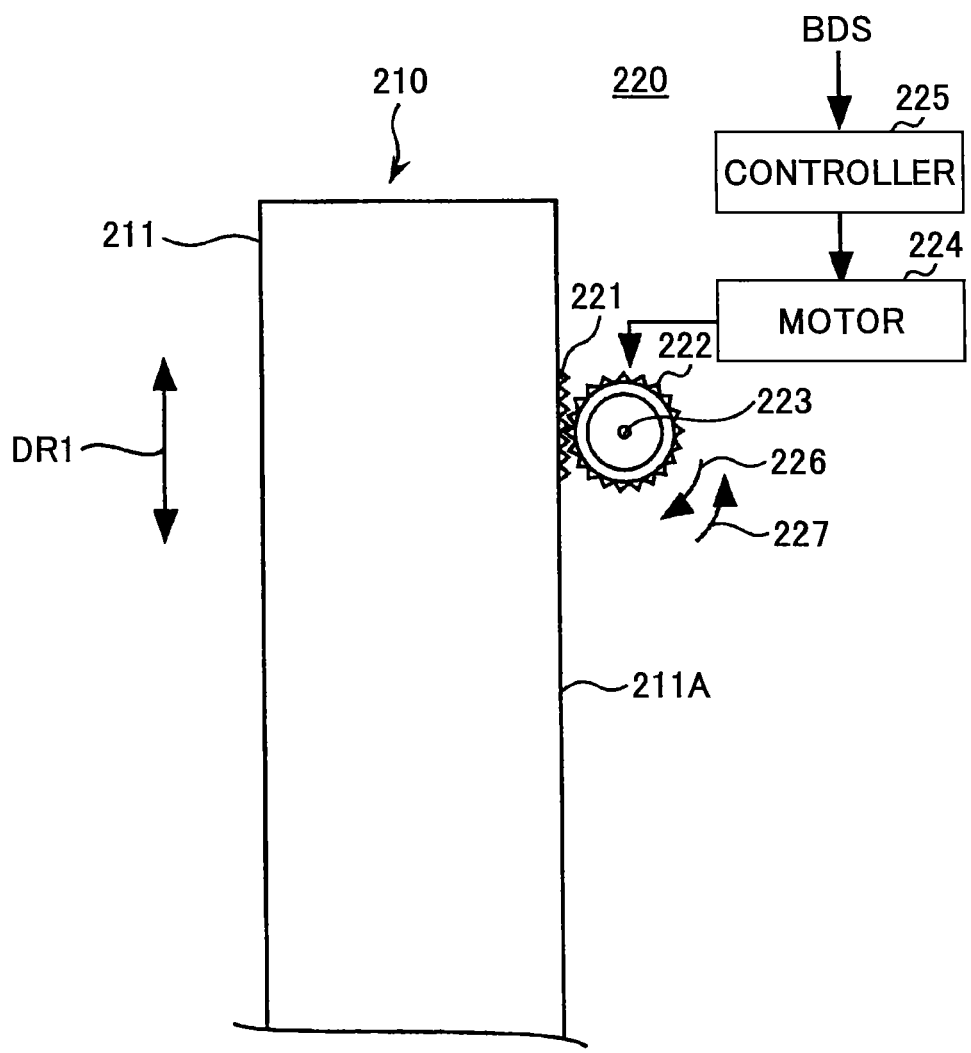
FIG. 17 is a schematic diagram showing the construction of an up/down mechanism shown in FIG. 15.

FIG. 17 is a schematic diagram showing the construction of the up/down mechanism 220 shown in FIG. 15. Referring to FIG. 17, the up/down mechanism 220 comprises a toothed member 221, a gear 222, a shaft member 223, a motor 224 and a control unit 225.

The toothed member 221 has a generally triangular cross-sectional shape and is fixed upon the outer peripheral surface 211A of the cylindrical member 211. The gear 222 is fixed upon an end of the shaft member 223 and meshes with the toothed member 221. The shaft member 223 has the foregoing end connected to the gear 222 and the other end connected to a shaft (not shown) of the motor 224.

The motor 224 causes the gear 222 to rotate in the direction of an arrow 226 or an arrow 227 in response to control from the control unit 225. The control unit 225 controls the motor 224 based on the vibration detection signal BDS from the vibration detection unit 240 and causes the gear 222 to rotate in the direction of the arrow 226 or 227.

When the gear 222 is rotated in the direction of the arrow 226, the support unit 210 moves in the upward direction in terms of the gravitational direction DR1, while when the gear 222 is rotated in the direction of the arrow 227, the support unit 210 is moved downward in terms of the gravitational direction DR1.

Thus, rotation of the gear 222 in the direction of the arrow 226 or 227 corresponds to a movement of the support unit 210 up or down in terms of the gravitational direction DR1.

Figure 18:
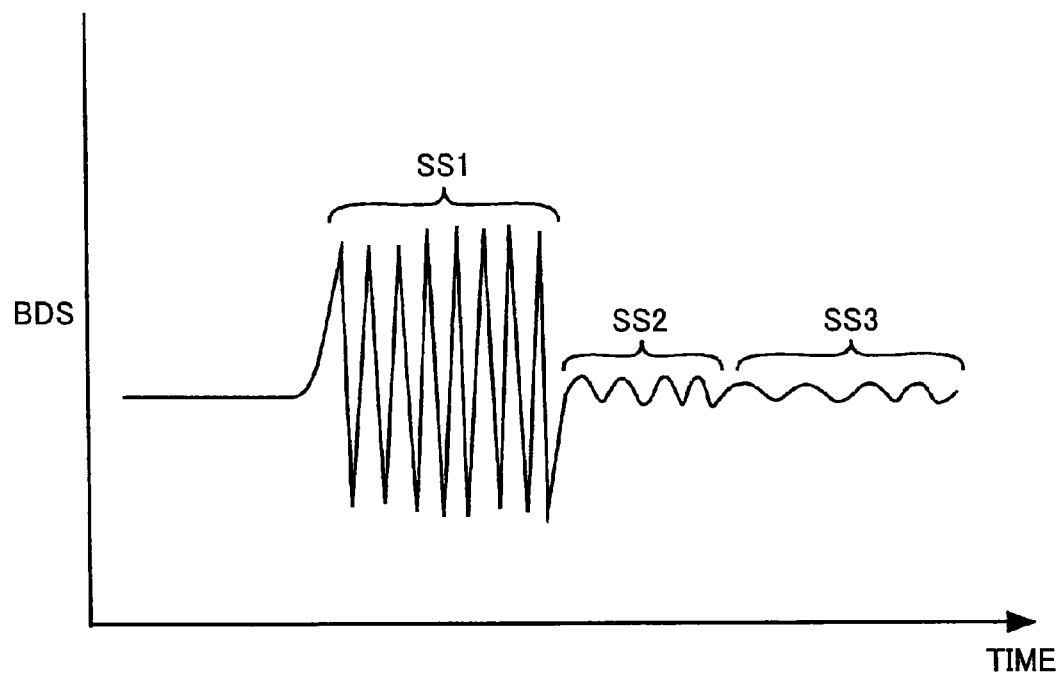
FIG. 18 is a timing chart showing a vibration detection signal.

FIG. 18 is a timing chart of the vibration detection signal BDS. Referring to FIG. 18, the vibration detection signal BDS detected by the vibration detection unit 240 comprises a signal component SS1 in the case the base body 5A is not in contact with the melt mixture 290, while in the case the base body 5A is in contact with the melt mixture 290, the vibration detection signal BDS is formed of a signal component SS2. Further, in the case the base body 5A is dipped into the melt mixture 290, the vibration detection signal BDS is formed of a signal component SS3.

In the event the seed base body 5A is not in contact with the melt mixture 290, the base body 5A is vibrated vigorously by the vibration applied by the vibration application unit 230 and the vibration detection signal BDS is formed of the signal component SS1 of relatively large amplitude. When the base body 5A is in contact with the melt mixture 290, the base body 5A cannot vibrate vigorously even when the vibration is applied from the vibration application unit 230 because of the viscosity of the melt mixture 290, and thus, the vibration detection signal BDS is formed of the signal component SS2 of relatively small amplitude. Further, when the base body 5A is dipped into the melt mixture 290, vibration of the base body 5A becomes more difficult because of the viscosity of the melt mixture 290, and the vibration detection signal BDS is formed of the signal component SS3 of further smaller amplitude than the signal component SS2.

Referring to FIG. 17, again, the control unit 225 detects, upon reception of the vibration detection signal from the vibration detection unit 240, the signal component in the vibration detection signal BDS. Thus, when the detected signal component is the signal component SS1, the control unit 225 controls the motor 224 such that the support unit 210 is lowered in the gravitational direction DR1, until the signal component SS2 is detected for the signal component of the vibration detection signal BDS.

More specifically, the control unit 225 controls the motor 224 such that the gear 222 is rotated in the direction of the arrow 227, and the motor 224 causes the gear 222 to rotate in the direction of the arrow 227 in response to the control from the control unit 225 via the shaft member 223. With this, the support member 210 moves in the downward direction in terms of the gravitational direction.

Further, the control unit 225 controls the motor 224 such that the rotation of the gear 222 is stopped when the signal component of the vibration detection signal BDS received from the vibration detection unit 240 has changed from the signal component SS1 to the signal component SS2, and the motor stops the rotation of the gear 222 in response to the control from the control unit 225. With this, the support unit 210 stops the movement thereof and the base body 5A is held at the vapor-liquid interface 3.

On the other hand, the control unit 225 controls the motor 224, when received the vibration detection signal BDS formed of the signal component SS2 from the vibration detection unit 240, such that the movement of the support unit 210 is stopped. In this case, the base body 5A is already in contact with the melt mixture 290.

Thus, the up/down mechanism 220 moves the support unit 50 in the gravitational direction DR1 based on the vibration detection signal BDS detected by the vibration detection unit 240, such that the base body 5A is in contact with the melt mixture 290.

Figure 19:
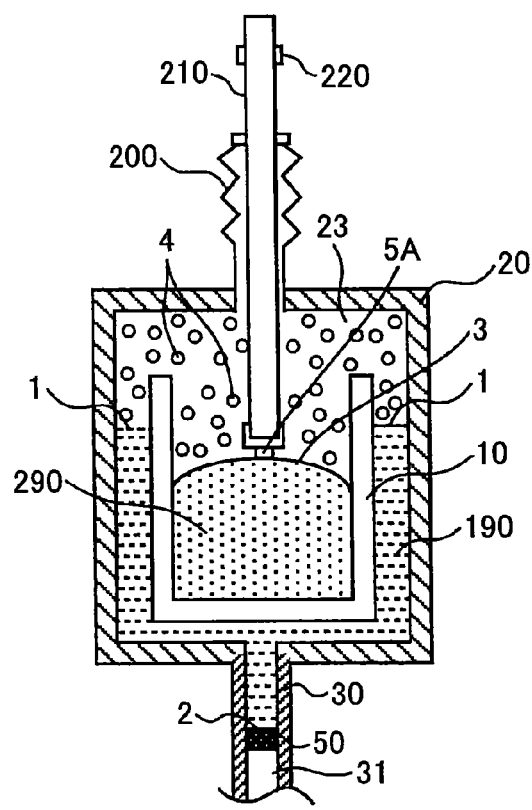
FIG. 19 is a schematic diagram showing the state inside the reaction vessel and the outer reaction vessel in the Embodiment 2 during the interval between two timings t1 and t2 shown in FIG. 8.

FIG. 19 is a schematic diagram showing the state inside the reaction vessel 10 and the outer reaction vessel 20 in the Embodiment 2 during the interval between two timings t1 and t2 shown in FIG. 8. When the heating units 60 and 70 start to heat the reaction vessel 10 and the outer reaction vessel 20, the temperature of the reaction vessel 10 and the outer reaction vessel 20 start to rise and reach a temperature of 98° C. at the timing t1 and a temperate of 800° C. at the timing t2.

With this, the metal Na held between the reaction vessel 10 and the outer reaction vessel 20 undergoes melting and the metal melt 190 (=metal Na liquid) is formed. Further, the nitrogen gas 4 inside the space 23 cannot escape to the space 31 inside the conduit 30 through the metal melt 190 (=metal Na melt) and the stopper/inlet plug 50, and the nitrogen gas 4 is confined into the space 23. Reference should be made to FIG. 19.

Further, during the interval from the timing t1 in which the temperature of the reaction vessel 10 and the outer reaction vessel 20 reaches 98° C. to the timing t2 in which the temperature of the reaction vessel 10 and the outer reaction vessel 20 reaches 800° C., it should be noted that the up/down mechanism 220 moves the support unit 210 up and down according to the method explained above in response to the vibration detection signal BDS from the vibration detection unit 240 and maintains the base body 5A in contact with the melt mixture 290.

When the temperatures of the reaction vessel 10 and the outer reaction vessel 20 have reached 800° C., the nitrogen gas 4 in the space 23 is incorporated into the melt mixture 290 via the mediating metal Na existing in the melt mixture 290. In this case, it should be noted that the concentration of nitrogen in the melt mixture 290 takes the maximum value in the vicinity of the vapor-liquid interface 3 between the space 23 and the melt mixture 290, and thus, growth of the GaN crystal starts from the base body 5A in contact with the vapor-liquid interface 3.

Thereafter, the GaN crystal is grown from the base body 5A during the interval from the timing t2 to the timing t3 under the condition where the oblique facets are formed (the region under the broken like k1 shown in FIG. 5) as explained with reference to FIG. 8, and the GaN crystal of flat top surface is grown thereafter during the interval from the timing t5 to the timing t6.

Figure 20:
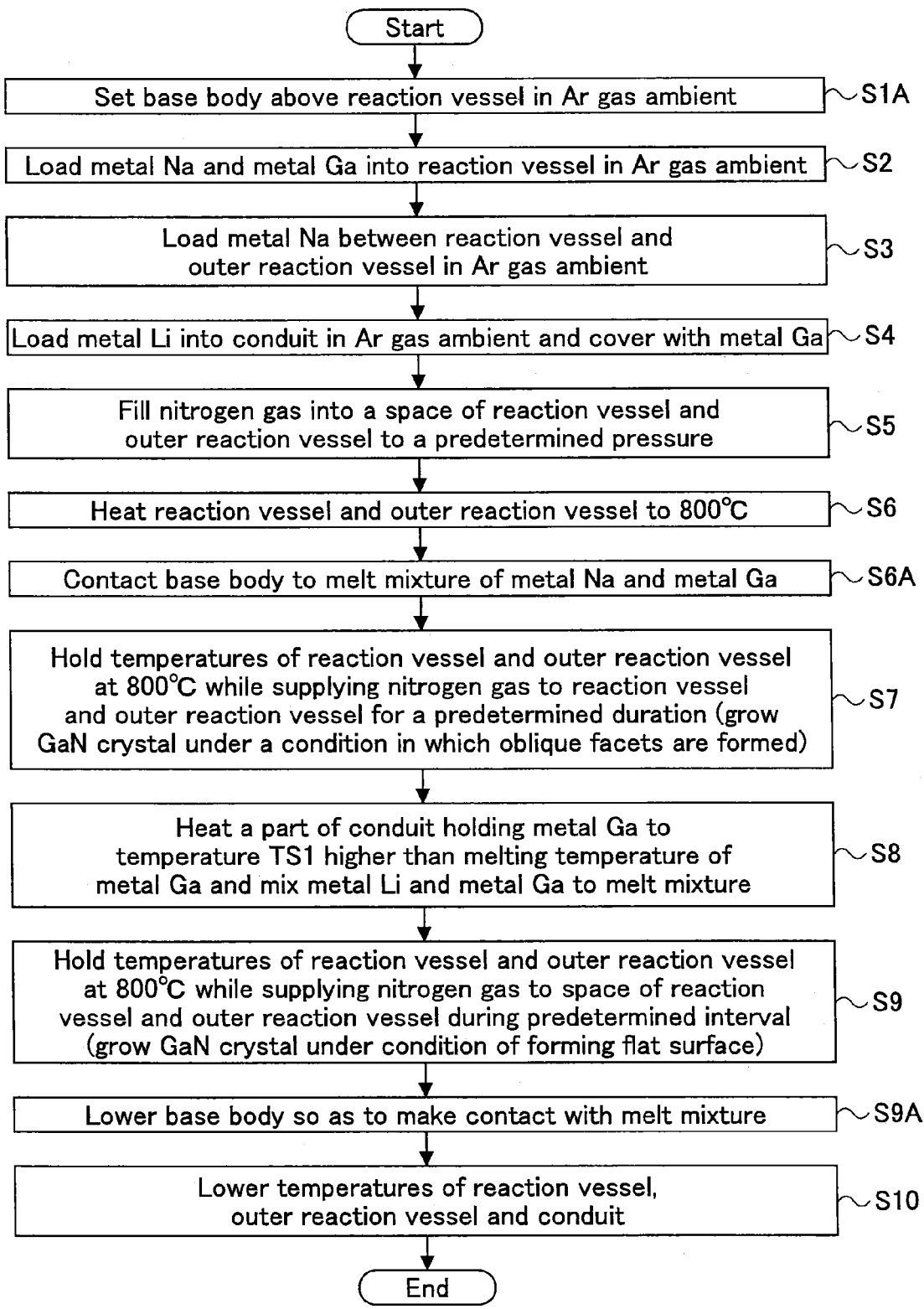
FIG. 20 is a flowchart explaining the manufacturing method of a GaN crystal according to Embodiment 2 of the present invention.

FIG. 20 is a flowchart explaining the manufacturing method of a GaN crystal according to Embodiment 2 of the present invention. It should be noted that the flowchart of FIG. 20 is identical to the flowchart shown in FIG. 11 except that the step S1 of the flowchart shown in FIG. 11 is replaced with a step S1A and steps S6A and S9A are added.

Referring to FIG. 20, the reaction vessel 10 and the outer reaction vessel 20 are incorporated into a glove box filled with an Ar gas when a series of processes are started. Further, the base body 5A is placed above the reaction vessel 10 in the Ar gas ambient (step S1A). More specifically, the base body 5A is set above the reaction vessel 10 by fitting the base body 5A to the space 214 formed on an end 2111 of the support unit 210.

Thereafter the steps S2-S6 are executed, and during the process in which the inner reaction vessel 10 and the outer reaction vessel 20 are heated to 800° C., the metal Na and the metal Ga inside the reaction vessel 10 become a liquid. Thus, the melt mixture 290 of metal Na and metal Ga is formed in the reaction vessel 10. Next, the up/down mechanism 220 causes the base body 5A to make a contact with the melt mixture 290 (step S6A).

Thereafter, the foregoing steps S7-S9 are executed. Further, in the steps S7 and S9, the up/down mechanism 220 lowers the base body 5A while the crystal growth of the GaN crystal is in progress as explained previously, such that the base body 5A makes a contact with the melt mixture 290.

Thereafter, the foregoing step S10 is carried out and manufacturing of the GaN crystal of reduced threading dislocations is completed.

Thus, it becomes possible to reduce the threading dislocations in the GaN crystal 550 also in the case of causing the base body 5A to make a contact with the surface of the melt mixture 290 (=interface 3) such that there occurs growth of the GaN crystal 530 with oblique facets and such that there occurs further growth of the GaN crystal 550 of flat surface.

In the flowchart shown FIG. 20, explanation was made such that the base body 5A is contacted with the melt mixture 190 of the metal Na and the metal Ga when the reaction vessel 10 and the outer reaction vessel 20 are heated to 800° C. (see steps S6 and S6A), while the present embodiment is not limited to such a specific example and it is also possible to hold the base body 5A inside the melt mixture 290 containing therein the metal Na and the metal Ga in the step S6A when the reaction vessel 10 and the outer reaction vessel 20 are heated to 800° C. (see step S6). Thus, when the reaction vessel 10 and the outer reaction vessel 20 are heated to 800° C., it is possible to carry out the crystal growth of the GaN crystal from the base body 5A by dipping the base body 5A into the melt mixture 290.

It should be noted that the operation for making the base body 5A to contact with the melt mixture 290 comprises: the step A for applying a vibration to the support unit 210 by the vibration application unit 230 and detecting the vibration detection signal BDS indicative of the vibration of the support unit 210; and the step B of moving the support unit 50 by the up/down mechanism 220 such that the vibration detection signal changes to the state (component SS2 of the vibration detection signal BDS) corresponding to the situation where the base body 5A has made contact with the melt mixture 290.

Further, it should be noted that the operation for holding the base body 5A in the melt mixture 290 comprises: the step A for applying a vibration to the support unit 210 by the vibration application unit 230 and detecting the vibration detection signal BDS indicative of the vibration of the support unit 210; and the step B of moving the support unit 210 by the up/down mechanism 220 such that the vibration detection signal changes to the state (component SS3 of the vibration detection signal BDS) corresponding to the situation where the base body 5A is dipped into the melt mixture 290.

In the steps B and C, it should be noted that the support unit 210 is moved by the up/down mechanism 220 because there is caused variation of location for the melt surface (=interface 3) for the melt mixture 290 formed in the reaction vessel 10 depending on the volume of the reaction vessel 10 and the total amount of the metal Na and the metal Ga loaded into the reaction vessel 10, as in the case of base body 5A being dipped into the melt mixture 290 at the moment when the melt mixture 290 is formed in the reaction vessel 10 or as in the case of the base body 5A being held in the space 23 and thus there is a need of moving the base body 5A up or down in the gravitational direction DR1 in order that the base body 5A makes a contact with the melt mixture 290 or the base body 5A is dipped into the melt mixture 290.

Further, while explanation has been made with the step S9A of the flowchart shown in FIG. 20 that the base body 5A is lowered such that the base body 5A makes a contact with the melt mixture 290, it should be noted that the step S9A of the present invention shown in the flowchart of FIG. 20 generally comprises a step D that moves the support unit 210 by the up/down mechanism 220 such that the GAN crystal grown from the base body 5A makes a contact with the melt mixture 290 during the growth of the GaN crystal.

It should be noted that, while there occurs lowering of the liquid surface (=interface 3) of the melt mixture 290 because of consumption of Ga in the melt mixture 290 with progress of growth of the GaN crystal, there may be a case in which it is necessary to move the GaN crystal grown from base body 5A in the upward direction or in the downward direction with the progress of growth of the GaN crystal, depending on the relationship between the rate of lowering the liquid surface (=interface 3) and the growth rate of the GaN crystal.

Thus, in the case the rate of lowering of the liquid surface (=interface 3) is faster than the growth rate of the GaN crystal, the GaN crystal grown from the base body 5A is moved downward for maintaining the contact of the GaN crystal with the liquid surface (=interface 3) of the melt mixture 290. On the other hand, in the case the rate of lowering of the liquid surface (=interface 3) is slower than the growth rate of the GaN crystal, the GaN crystal grown from the base body 5A is moved upward for maintaining the contact of the GaN crystal with the liquid surface (=interface 3) of the melt mixture 290.

Thus, in view of the need of moving the GaN crystal grown from the seed crystal 5 up or down in the gravitational direction DR1 depending on the relationship between the lowering rate of the liquid surface (=interface 3), the step D is defined as "moving the support unit 210 by the up/down mechanism 220".

Further, it should be noted that the operation for making the GaN crystal grown from the base body 5A to contact with the melt mixture 290 comprises the step A and the step B noted above.

Figure 21:
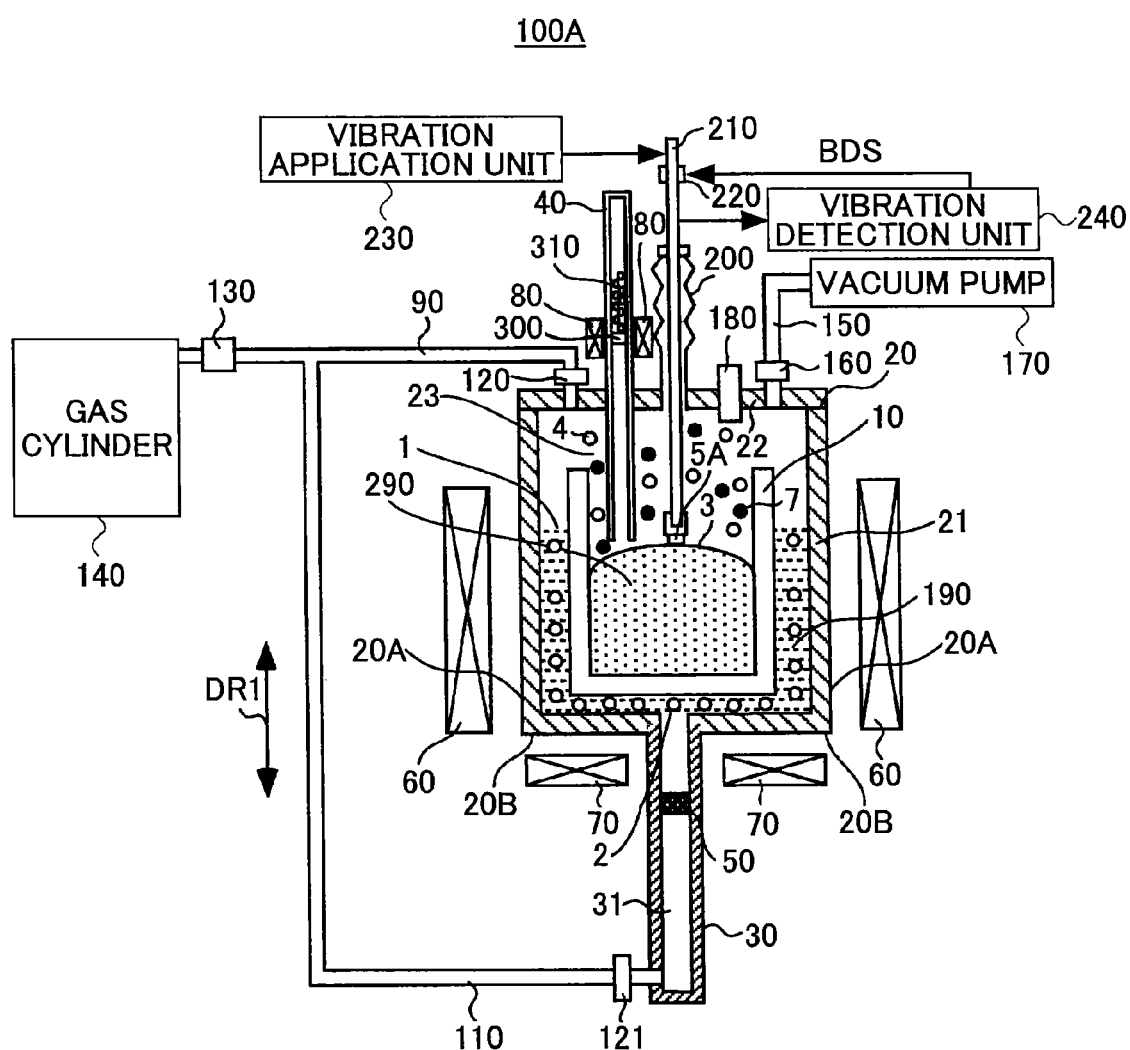
FIG. 21 is a schematic diagram showing the state inside the reaction vessel and the outer reaction vessel in the steps S7 and S9 shown in FIG. 20.

FIG. 21 is a schematic diagram showing the state inside the reaction vessel 10 and the outer reaction vessel 20 in the steps S7 and S9 shown in FIG. 20. Referring to FIG. 21, the temperatures of the reaction vessel 10 and the outer reaction vessel 20 are held at 800° C. during the interval from the timing t2 to the timing t6, and growth of the GaN crystal proceeds in the melt mixture 290. Further, with progress of growth of the GaN crystal, there occurs evaporation of metal Na from the metal melt 190 and the melt mixture 290, and thus, there exist a mixture of the nitrogen gas 4 and the metal Na vapor 7 in the space 23.

Further, with consumption of the nitrogen gas 4, the pressure P1 of the space 23 is lowered than the pressure P2 of the space 31 inside the conduit 30.

Then the nitrogen gas is supplied from the space 31 of the conduit 30 to the metal melt 190 via the stopper/inlet plug 50, wherein the nitrogen gas moves through the metal melt 190 in the form of bubbles 191. Thus, the nitrogen gas is supplied to the space 23 through the vapor-liquid interface 1. Now, when the pressure P1 of the space 23 becomes generally equal to the pressure P2 inside the space 31, the supply of the nitrogen gas from the space 30 of the conduit 31 to the reaction vessel 50 and the outer reaction vessel 10 via the stopper/inlet plug 20 and the metal melt 190 is stopped.

Further, the crystal growth apparatus 100 has the feature of growing the GaN crystal in the state in which the metal Na vapor 23 is confined in the space 5023. In the state the metal Na vapor 7 is confined in the space 23, the vapor pressure of the metal Na evaporated from the metal melt 190 becomes generally identical to the vapor pressure of the metal Na evaporated from the melt mixture 290. Thus, with the foregoing feature, it becomes possible to suppress the variation of mole ratio between the metal Na and the metal Ga in the melt mixture 290 caused by the migration of metal Na from the metal melt 190 to the melt mixture 290 or by the migration of metal Na from the melt mixture 290 to the melt mixture 190. As a result, it becomes possible to grow a large, high-quality GaN crystal.

Figure 22:
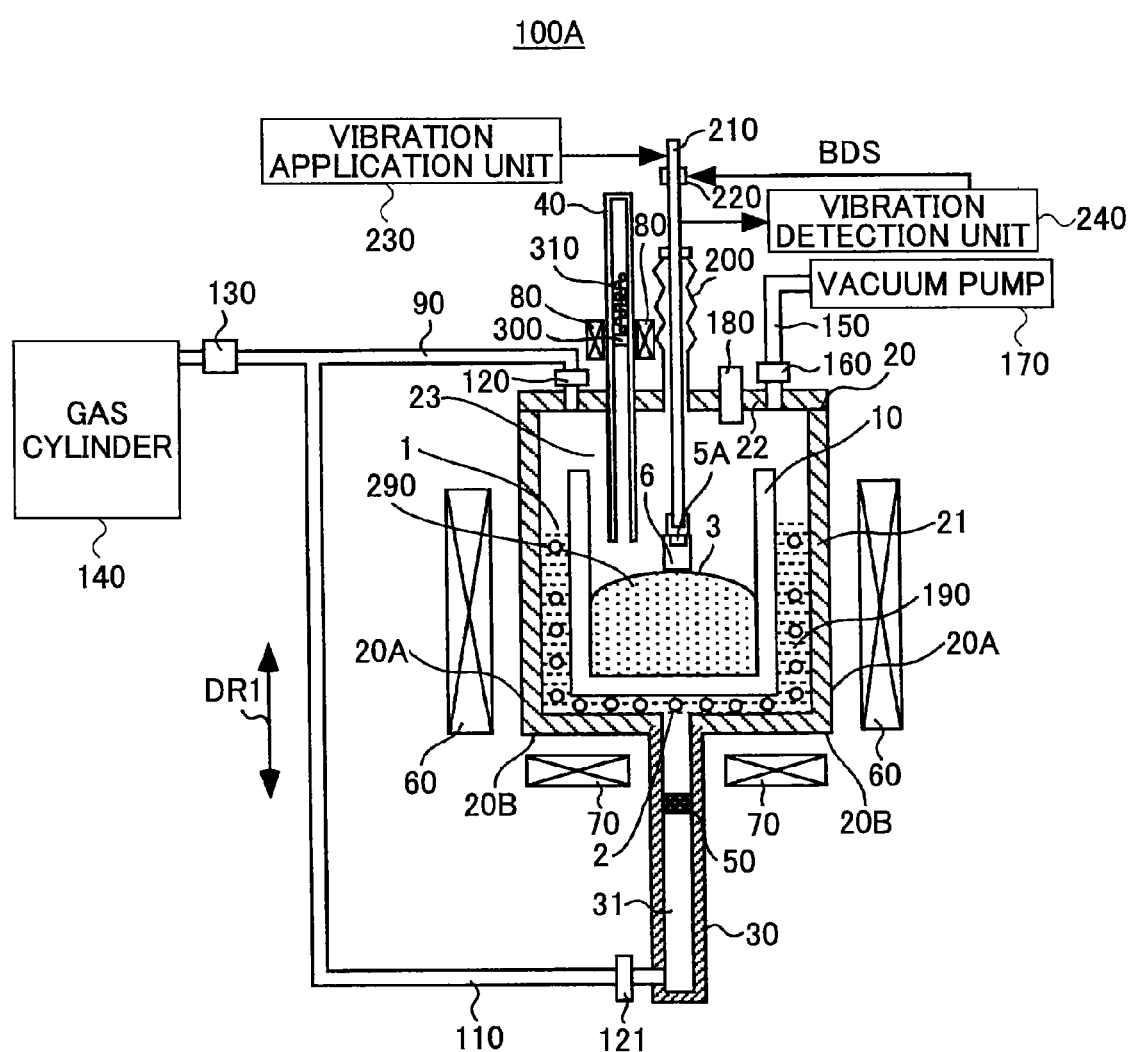
FIG. 22 is a schematic diagram showing the state inside the reaction vessel and the outer reaction vessel in the steps S9A shown in FIG. 20.

FIG. 22 is a schematic diagram showing the state inside the reaction vessel 10 and the outer reaction vessel 20 in the step S9A shown in FIG. 20. It can be seen that there is caused lowering of the vapor-liquid interface 3 with progress of the growth of the GaN crystal and the GaN crystal 6 grown from the base body 5A separates from the melt mixture 290.

When this occurs, the vibration detection signal BDS becomes solely from the component SS1 (see FIG. 18), and thus, the up/down mechanism 220 lowers the support unit 210 in response to the vibration detection signal BDS such that the GaN crystal 6 makes a contact with the melt mixture 290 according to the process explained above. Thereby, the GaN crystal contacts with the metal mixture 290 again, and there occurs the preferential growth the GaN crystal 6.

Thus, with Embodiment 2, the base body 5A or the GaN crystal 6 grown from the base body 5A is made contact with the melt mixture 290 constantly during the growth of the GaN crystal.

With this, it becomes possible to grow a GaN crystal of large size.

Further, while the present embodiment has been explained for the case in which the support unit 210 is applied with vibration and the base body 5A or the GaN crystal 6 is controlled to make a contact with the melt mixture 290 while detecting the vibration of the support unit 210, the present embodiment is not limited to such a construction and it is also possible to cause the base body 5A or the GaN crystal 6 to make a contact with the melt mixture 290 by detecting the location of the vapor-liquid interface 3. In this case, an end of a conductor wire is connected to the outer reaction vessel 20 from the outside and the other end is dipped into the melt mixture 290. Further, an electric current is caused to flow through the conductor wire in this state and location of the vapor-liquid interface 3 is detected in terms of the length of the conductor wire in the outer reaction vessel 20 in which there has been noted a change of the current from Off to On.

Thus, when the other end of the conductor wire is dipped into the melt mixture 290, there is caused conduction of the current through the melt mixture 290, the reaction vessel 10, the metal melt 190 and the outer reaction vessel 20, while when the other end is not dipped into the melt mixture 290, no current flows through the conductor wire.

Thus, it is possible to detect the location of the vapor-liquid interface 20 by the length of the conductor wire inserted into the outer reaction vessel 3 for the case of causing the change of state of the electric current from Off to On. When the location of the vapor-liquid interface 3 is detected, the up/down mechanism 220 lowers the base body 5A or the GaN crystal 6 to the location of the detected vapor-liquid interface 3.

Further, it is also possible to detect the location of the vapor-liquid interface 3 by emitting a sound to the vapor-liquid interface 3 and measuring the time for the sound to go and back to and from the vapor-liquid interface 3.

Further, it is possible to insert a thermocouple into the reaction vessel 20 from the outer reaction vessel 10 and detect the location of the vapor-liquid interface 20 from the length of the thermocouple inserted into the outer reaction vessel 3 at the moment when the detected temperature has been changed.

In the foregoing, explanation has been made that the crystal growth of the GaN crystal 550 of reduced threading dislocations is made by causing the base body 5A to make a contact with the surface of the melt mixture 290 (=interface 3) by using the support unit 210, the present invention is not limited to such a construction and it is also possible to achieve the crystal growth of the GaN crystal 550 of reduced threading dislocations by causing the base body 5, 5B or 5C to make a contact with the surface of the melt mixture 290 (=interface 3) in place of the base body 5A by using the support unit 210.

In the case of using the base body 5 or 5C, the support unit 210 is formed by a hollow cylindrical member and form plural apertures at the tip end part of the hollow cylindrical member. The base body 5 or 5C is thereby supported by vacuum chuck by evacuating the interior of the hollow cylindrical member.

Further, while it has been described in the foregoing that the base body 5A is moved up or down depending on the relationship between the crystal growth rate of the GaN crystal and the lowering rate of the interface 3 for maintaining contact of the base body 5A with the interface 3, it is also possible to move the support unit 210 up or down by the up/down mechanism 220 so as to maintain the contact of the GaN crystal 6 with the interface 3, by taking into consideration the effect of rising of the interface 3 caused by dipping of the GaN crystal 6 grown from the base body 5A into the melt mixture 290 and the effect of the lowering of the interface caused by the upward movement of the GaN crystal 6 from the melt mixture 290.

In the case the temperature of the metal melt 190 is equal to the temperature of the melt mixture 290, the vapor pressure of the metal Na evaporated from the metal melt 190 becomes higher than the vapor pressure of the metal Na evaporated from the melt mixture 290. Thus, in such a case, the metal Na migrates from the metal melt 190 to the melt mixture 290 and there is caused rising of the interface 3. Thus, in the event the temperature of the metal melt 190 and the temperature of the melt mixture 290 are set equal, it is possible to move the support unit 210 up or down by the up/down mechanism 220 such that the GaN crystal 6 makes a contact with the interface 3 while taking into consideration of the effect of rising of the interface 3 caused by the migration of the metal Na from the metal melt 190 to the melt mixture 290.

Further, with growth of the GaN crystal 6, the metal Ga in the melt mixture 290 is consumed while this consumption of the metal Ga invites lowering of the interface 3. Thus, it is also possible to move the support unit 210 up or down by the up/down mechanism 220 such that the GaN crystal 6 makes a contact with the interface 3 while taking into consideration the amount of consumption of the metal Ga.

Otherwise, the present embodiment is identical to Embodiment 1.

[Embodiment 3]

Figure 23:
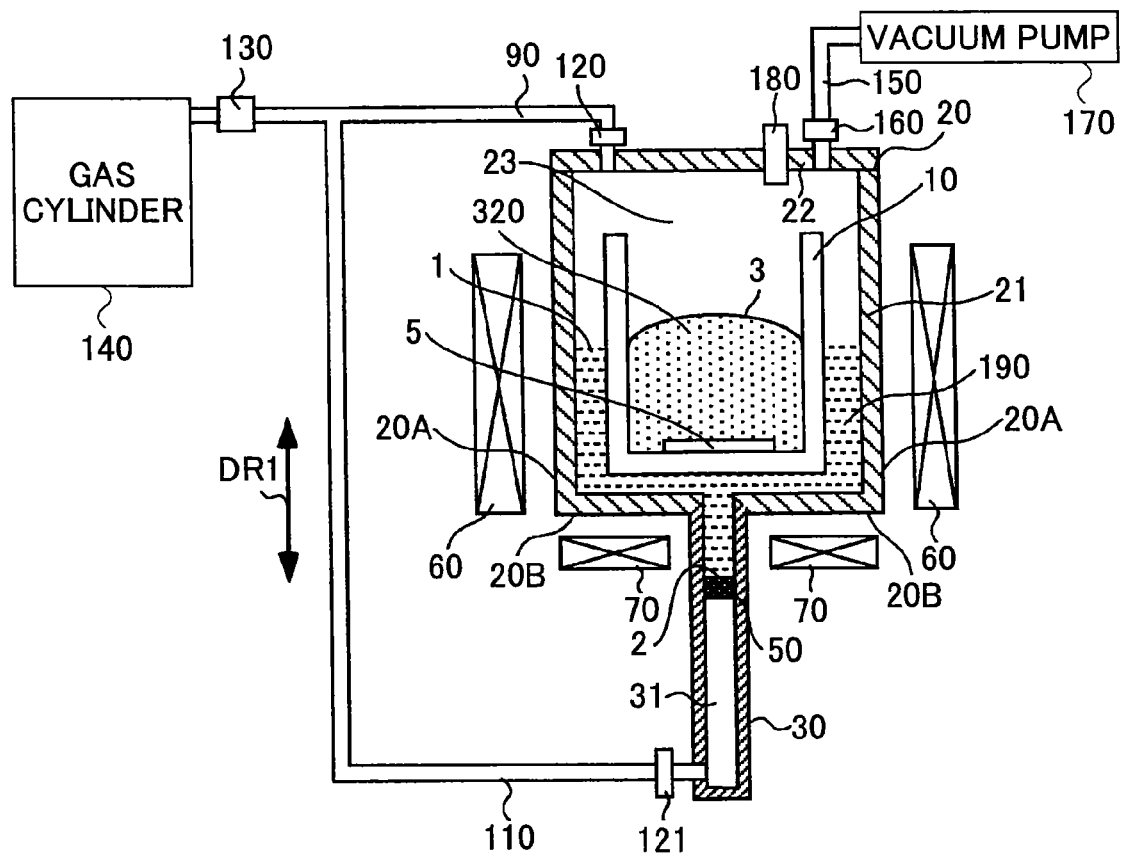
FIG. 23 is a schematic cross-sectional diagram showing a crystal growth apparatus according to Embodiment 3 of the present invention.

FIG. 23 is a schematic cross-sectional diagram showing a crystal growth apparatus according to Embodiment 3 of the present invention. Referring to FIG. 23, a crystal growth apparatus 100B of Embodiment 3 has a construction generally identical with the construction of the crystal growth apparatus 100 shown in FIG. 1, except that the conduit 40 and the heating unit 80 are removed.

With the crystal growth apparatus 100B, the reaction vessel 10 holds a melt mixture 320 in place of the melt mixture 290. The melt mixture 320 comprises a melt mixture of metal Na and metal Ga.

Figure 24:
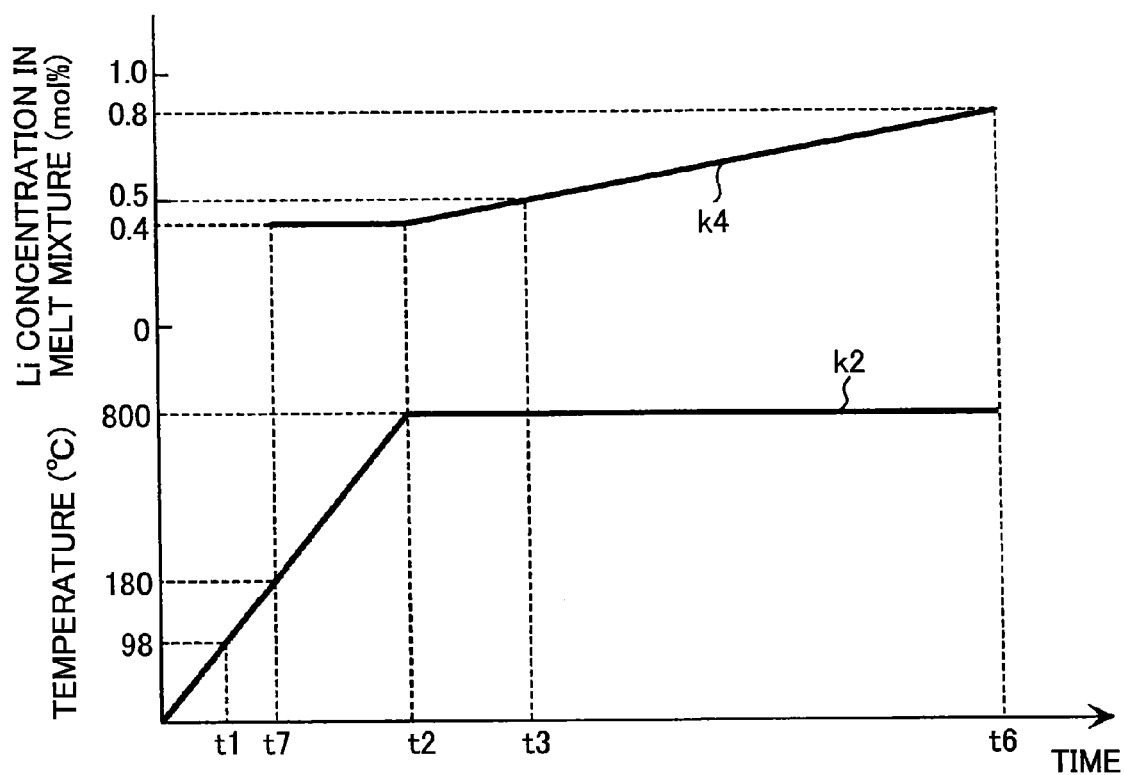
FIG. 24 is a timing chart showing the temperature of the reaction vessel and the outer reaction vessel and a Li concentration in the melt mixture.

FIG. 24 is a timing chart showing the temperature of the reaction vessel 10 and the outer reaction vessel 20 and a Li concentration in the melt mixture 320. Referring to FIG. 24, the temperatures of the reaction vessel 10 and the outer reaction vessel 20 are elevated in the crystal growth apparatus 100B along the curve k2 and are held at 800° C. similarly to the crystal growth apparatus 100.

The curve k4 represents the Li concentration in the melt mixture 320.

It can be seen that the Li concentration increases with a constant rate in the interval from the timing t2 to the timing t6.

In the present case, the Li concentration becomes 0.5 mol % at the timing t3 and 0.8 mol % at the timing t6.

As explained in Embodiment 1, there occurs a crystal growth of a GaN crystal having a dimple surface, and thus the GaN crystal 530 having the oblique faces, in the case the Li concentration in the melt mixture 320 is lower than the range of 0.5-0.8 mol %. On the other hand, in the case the Li concentration in the melt mixture 320 is in the rage of 0.5-0.8 mol %, there takes place the crystal growth of a GaN crystal having a generally flat surface.

Thus, the present embodiment forms the GaN crystal 430 having the oblique facets on the base body 5 during the interval from the timing t2 to the timing t3 and forms the GaN crystal 550 of generally flat surface on the GaN crystal 530 during the interval from the timing t3 to the timing t6.

With progress of the crystal growth of the GaN crystals 530 and 550, the metal Ga in the melt mixture 320 is decreased, and as a result, the Li concentration in the melt mixture 320 increases with a constant rate shown by the curve k4 during the interval from the timing t2 to the timing t6.

In order to set the Li concentration to be equal to or lower than 0.5 mol % at the timing t2 in which the crystal growth of the GaN crystal 530 on the base body 5 is started, it is sufficient to load the metal La with an amount smaller than the Li amount of 2.2 mg shown in Table 1 in the reaction vessel 10 together with the metal Na and metal Ga in the glove box.

Figure 25:
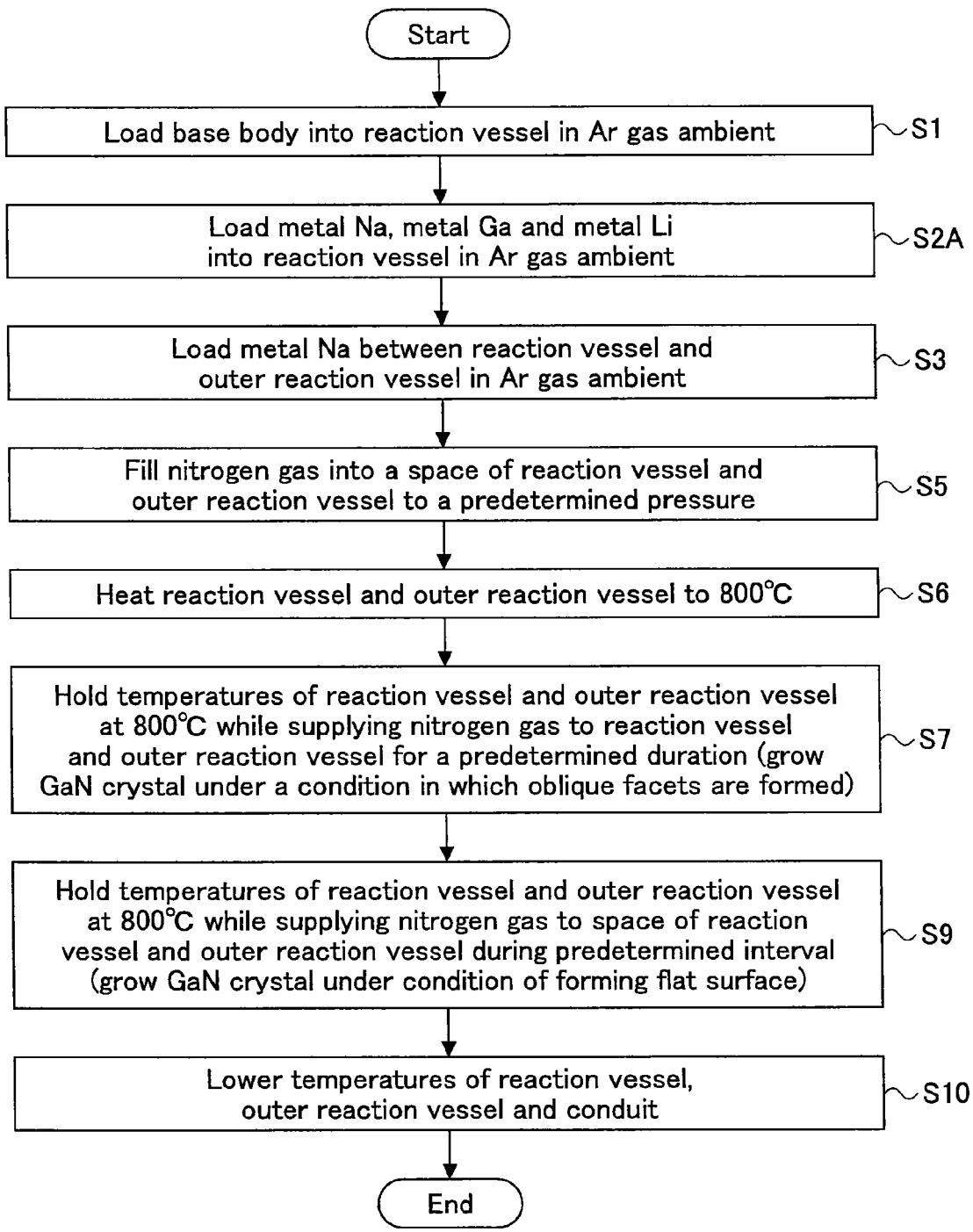
FIG. 25 is a flowchart explaining the manufacturing method of a GaN crystal according to Embodiment 3 of the present invention.

FIG. 25 is a flowchart explaining the manufacturing method of a GaN crystal according to Embodiment 3 of the present invention. It should be noted that the flowchart of FIG. 25 is identical to the flowchart shown in FIG. 11 except that the step S2 of the flowchart shown in FIG. 11 is replaced with a step S2A and the steps S4 and S8 are deleted.

Referring to FIG. 25, the metal Ga and metal Li are loaded into the reaction vessel 10 in the Ar gas ambient after the step S1 noted above (step S2A). Thereafter, the steps S3 and S5-S7, S9 and S10 are executed consecutively, and the GaN crystals 530 and 550 are formed on the base body 5 consecutively.

In this case, the step S7 is executed during the interval from the timing t2 to the timing t3 shown in FIG. 24, and the step S9 is executed during the interval from the timing t3 to the timing t6 showing in FIG. 24.

Figure 26:
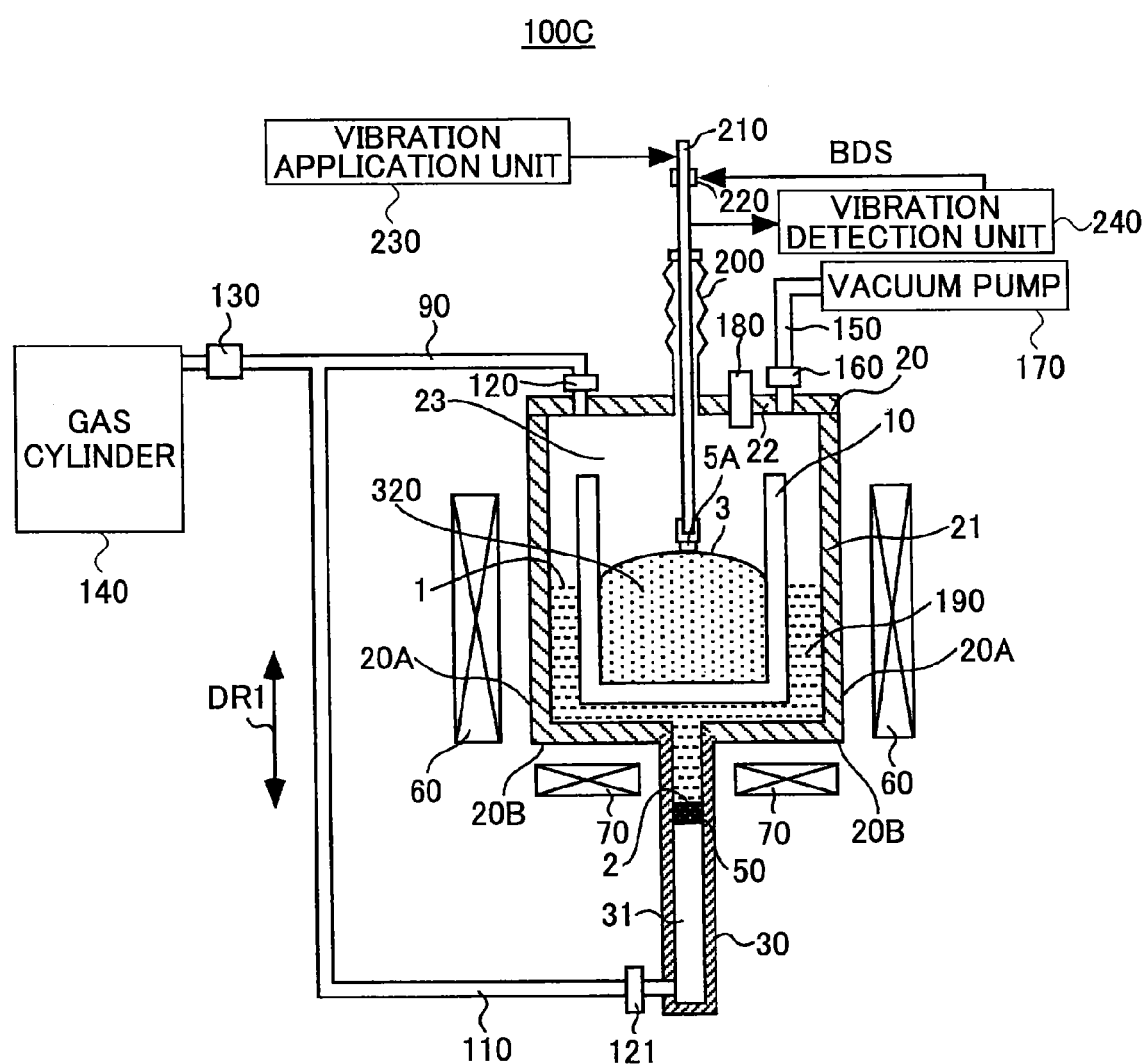
FIG. 26 is another schematic cross-sectional diagram showing a crystal growth apparatus according to Embodiment 3 of the present invention.

FIG. 26 is another schematic cross-sectional diagram showing a crystal growth apparatus according to Embodiment 3 of the present invention. It should be noted that the crystal growth apparatus of Embodiment 3 may be the crystal growth apparatus 100C shown in FIG. 26. Referring to FIG. 26, the crystal growth apparatus 100C has a construction generally identical with the construction of the crystal growth apparatus 100A, except that the conduit 40 and the heating unit 80 are removed from the crystal growth apparatus 100A shown in FIG. 15.

With the crystal growth apparatus 100C, the reaction vessel 10 holds a melt mixture 320 in place of the melt mixture 290 similarly to the crystal growth apparatus 100B.

Thus, the crystal growth apparatus 100C changes the Li concentration in the melt mixture 320 along the curve k4 during the interval from the timing t2 to the timing t6 shown in FIG. 24, and the GaN crystals 530 and 550 are grown consecutively from the seed crystal 5A.

Figure 27:
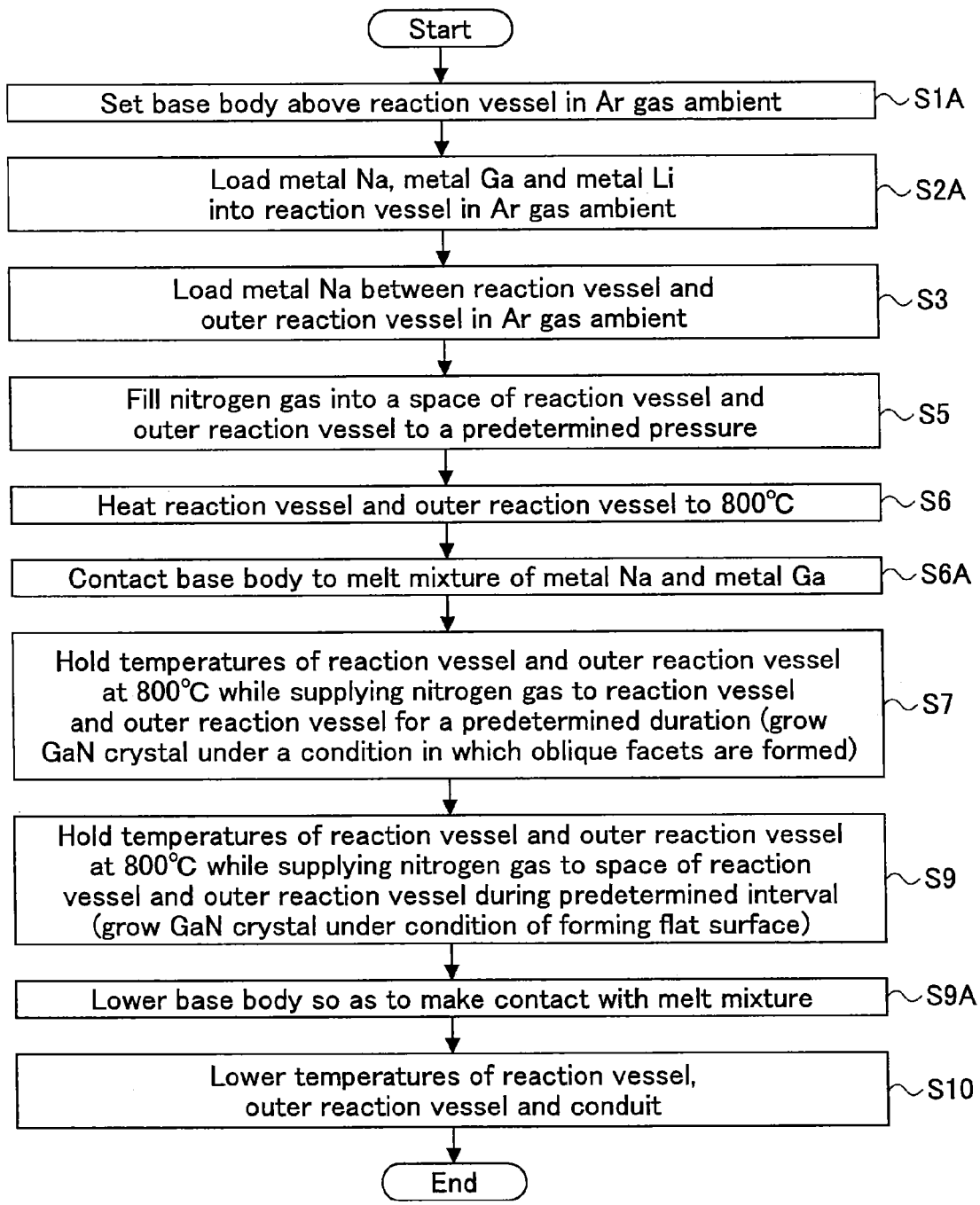
FIG. 27 is another flowchart explaining the manufacturing method of a GaN crystal according to Embodiment 3 of the present invention.

FIG. 27 is another flowchart explaining the manufacturing method of a GaN crystal according to Embodiment 3 of the present invention. It should be noted that the flowchart of FIG. 27 is identical to the flowchart shown in FIG. 20 except that the step S2 of the flowchart shown in FIG. 20 is replaced with a step S2A and the steps S4 and S8 are deleted.

Referring to FIG. 27, the metal Ga and metal Li are loaded into the reaction vessel 10 in the Ar gas ambient after the step S1 noted above (step S2A). Thereafter, the steps S3, S5, S6, S6A, S7, S9, S9A and S10 are executed consecutively, and the GaN crystals 530 and 550 are formed on the base body 5 consecutively.

In this case, too, the step S7 is executed during the interval from the timing t2 to the timing t3 shown in FIG. 24, and the step S9 is executed during the interval from the timing t3 to the timing t6 showing in FIG. 24.

Thus, it is possible to manufacture a GaN crystal of reduced dislocation density also by the method of loading the metal Na, metal Ga and metal Li into the reaction vessel 10 in the glove box, by deflecting the threading dislocations in the direction different from the crystal growth direction from the base body 5.

Otherwise, the present embodiment is identical to Embodiment 1 or Embodiment 2.

Figure 28:
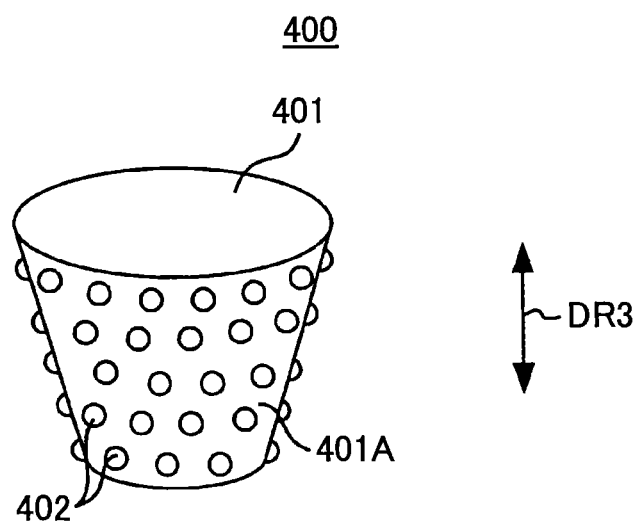
FIG. 28 is another oblique view diagram of the stopper/inlet plug according to the present invention.
Figure 29:
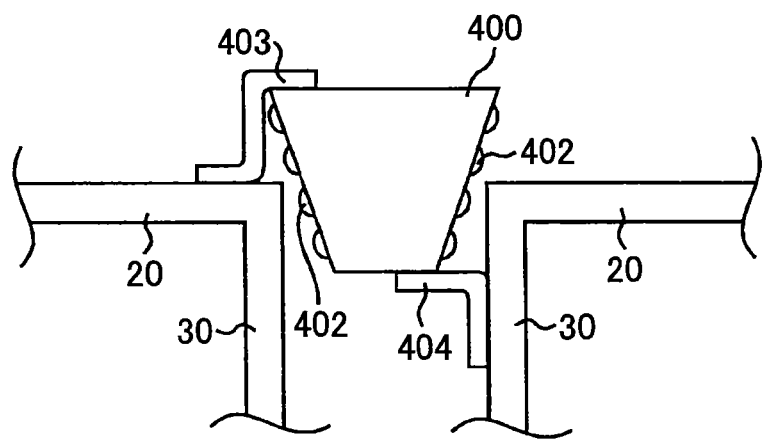
FIG. 29 is a cross-sectional diagram showing the method for mounting the stopper/inlet plug shown in FIG. 23.

FIG. 28 is another oblique view diagram of the stopper/inlet plug according to the present invention. Further, FIG. 29 is a cross-sectional diagram showing the method for mounting the stopper/inlet plug 400 shown in FIG. 28. Referring to FIG. 28, the stopper/inlet plug 400 comprises a plug 401 and a plurality of projections 402. The plug 401 is formed of a cylindrical body that changes the diameter in a length direction DR3. Each of the projections 402 has a generally semispherical shape of the diameter of several ten microns. The projections 402 are formed on an outer peripheral surface 401A of the plug 401 in a random pattern. Thereby, the separation between adjacent two projections 402 is set to several ten microns.

Referring to FIG. 29, the stopper/inlet plug 400 is fixed to a connection part of the outer reaction vessel 20 and the conduit 30 by support members 403 and 404. More specifically, the stopper/inlet plug 400 is fixed by being sandwiched between the support member 403 having one end fixed upon the outer reaction vessel 20 and the support member 404 having one end fixed upon an inner wall surface of the conduit 30.

In the present case, the projections 400 of the stopper/inlet plug 402 may or may not contact with the outer reaction vessel 20 or the conduit 30. In the event the stopper/inlet plug 402 is fixed in the state in which the projections 400 do not contact with the outer reaction vessel 20 and the conduit 30, the separation between the projections 402 and the reaction vessel 20 or the separation between the projections 400 and the conduit 30 is set such that the metal melt 190 can be held by the surface tension thereof, and the stopper/inlet plug 403 is fixed in this state by the support members 404 and 4404.

The metal Na held between the reaction vessel 10 and the outer reaction vessel 20 takes a solid form before heating of the reaction vessel 10 and the outer reaction vessel 20 is commenced, and thus, the nitrogen gas supplied from the gas cylinder 140 can cause diffusion between the space 20 inside the outer reaction vessel 23 and the space 30 inside the conduit 31 through the stopper/inlet plug 400.

When heating of the reaction vessel 10 and the outer reaction vessel 20 is started and the temperatures of the reaction vessel 10 and the outer reaction vessel 20 are elevated to 98° C. or higher, the metal Na held between the reaction vessel 10 and the outer reaction vessel 20 undergoes melting to form the metal melt 190, while the metal melt 190 thus formed functions to confine the nitrogen gas into the space 23.

Further, the stopper/inlet plug 400 holds the metal melt 190 by the surface tension thereof such that the metal melt 190 does not flow out from the interior of the outer reaction vessel 20 to the space 30 of the conduit 31.

Further, with progress of the growth of the GaN crystal, the metal melt 190 and the stopper/inlet plug 400 confine the nitrogen gas and the metal Na vapor evaporated from the metal melt 190 and the melt mixture 290 into the space 23. As a result, the variation of mole ratio of the metal Na and metal Ga in the melt mixture 290 caused by the migration of the metal Na from the metal melt 190 to the melt mixture 290 and the migration of metal Na from the melt mixture 290 to the metal melt 190 is suppressed. Further, when there is caused a decrease of nitrogen gas in the space 23 with progress of growth of the GaN crystal, the pressure P1 of the space 23 becomes lower than the pressure P2 of the space 30 inside the conduit 31, and the stopper/inlet plug 400 supplies the nitrogen gas to the space 31 via the metal melt 190 by causing to flow the nitrogen gas therethrough in the direction toward the outer reaction vessel 20.

Thus, the stopper/inlet plug 400 functions similarly to the stopper/inlet plug 50 explained before. Thus, the stopper/inlet plug 400 can be used in the crystal growth apparatuses 100, 100A, 100B and 100C in place of the stopper/inlet plug 50.

While it has been explained that the stopper/inlet plug 400 has the projections 402, it is also possible that the stopper/inlet plug 400 does not have the projections 402. In this case, the stopper/inlet plug 400 is fixed by the support members such that the separation between the plug 401 and the reaction vessel 20 or the separation between the plug 401 and the conduit 30 becomes several ten microns.

Further, it is also possible to set the separation between the stopper/inlet plug 400 (including both of the cases in which the stopper/inlet plug 402 carries the projections 402 and the case in which the stopper/inlet plug 400 does not carry the projections 402) and the outer reaction vessel 20 and between the stopper/inlet plug 400 and the conduit 30 according to the temperature of the stopper/inlet plug 400. In this case, the separation between the stopper/inlet plug 400 and the reaction vessel 20 or the separation between the stopper/inlet plug 400 and the conduit 30 is set relatively narrow when the temperature of the stopper/inlet plug 400 is relatively high. When the temperature of the stopper/inlet plug 400 is relatively low, on the other hand, the separation between the stopper/inlet plug 400 and the reaction vessel 20 or the separation between the stopper/inlet plug 400 and the conduit 30 is set relatively large.

It should be noted that the separation between the stopper/inlet plug 400 and the reaction vessel 20 or the separation between the stopper/inlet plug 400 and the conduit 30 that can hold the metal melt 190 changes depending on the temperature of the stopper/inlet plug 400. This, with this embodiment, the separation between the stopper/inlet plug 400 and the reaction vessel 20 or the separation between the stopper/inlet plug 400 and the conduit 30 is changed in response to the temperature of the stopper/inlet plug 400 such that the metal melt 190 is held securely by the surface tension.

The temperature control of the stopper/inlet valve 400 is achieved by the heating unit 70. Thus, when the stopper/inlet plug 400 is to be heated to a temperature higher than 150° C., the stopper/inlet plug 400 is heated by the heating unit 70.

Figure 30A:
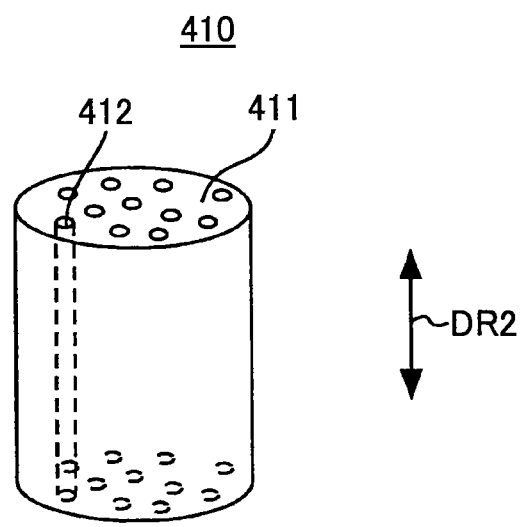
FIGS. 30A and 30B are further oblique view diagrams of the stopper/inlet plug according to the present embodiment.
Figure 30B:
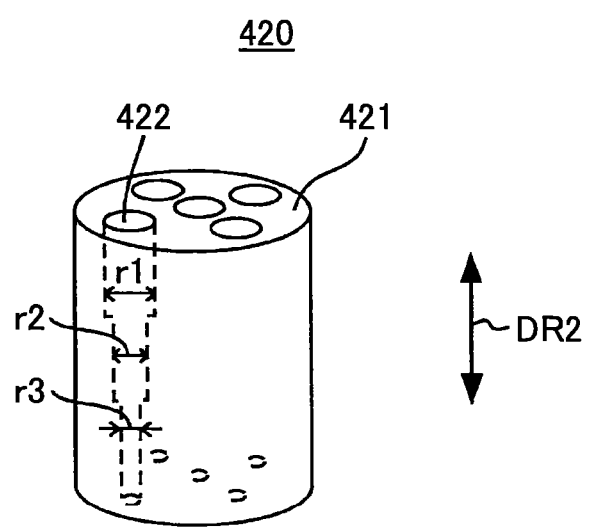

FIG. 30 is a further oblique view diagram of the stopper/inlet plug according to the present invention. Referring to FIG. 30, the stopper/inlet plug 410 comprises a plug 411 formed with a plurality of penetrating holes 412. The plurality of penetrating holes 412 are formed in the length direction DR2 of the plug 411. Further, each of the plural penetrating holes 412 has a diameter of several ten microns (see FIG. 30A).

With the stopper/inlet plug 410, it is sufficient that there is formed at least one penetrating hole 412.

Further, the stopper/inlet plug 420 comprises a plug 421 formed with plural penetrating holes 422. The plurality of penetrating holes 422 are formed in the length direction DR2 of the plug 421. Each of the penetrating holes 422 have a diameter that changes stepwise from a diameter r1, r2 and r3 in the length direction DR2. Here, each of the diameters r1, r2 and r3 is determined in the range such as several microns to several ten microns in which the metal melt 190 can be held by the surface tension Reference should be made to FIG. 30B.

With the stopper/inlet plug 420, it is sufficient that there is formed at least one penetrating hole 422. Further, it is sufficient that the diameter of the penetrating hole 422 is changed at least in two steps. Alternatively, the diameter of the penetrating hole 422 may be changed continuously in the length direction DR2.

The stopper/inlet plug 410 or 420 can be used in any of the crystal growth apparatuses 100, 100A 100B and 100C in place of the stopper/inlet plug 50.

In the case the stopper/inlet plug 420 is used in the crystal growth apparatus 100, 100A, 100B or 100C in place of the stopper/inlet plug 50, it becomes possible to hold the metal melt 190 by the surface tension thereof by one of the plural diameters that are changed stepwise without conducting precise temperature control, and it becomes possible to manufacture a GaN crystal of large size without conducting precise temperature control of the stopper/inlet plug 420.

Further, with the present invention, it is possible to use a porous plug or check valve in place of the stopper/inlet plug 50. The porous plug may be the one formed of a sintered body of stainless steel powders. Such a porous plug has a structure in which there are formed a large number of pores of several ten microns. Thus, the porous plug can hold the metal melt 190 by the surface tension thereof similarly to the stopper/inlet plug 60 explained before.

Further, the check valve of the present invention may include both a spring-actuated check valve used for low temperature regions and a piston-actuated check valve used for high temperature regions. This piston-actuated check valve is a check valve of the type in which a piston guided by a pair of guide members is moved in the upward direction by the differential pressure between the pressure P2 of the space 31 and the pressure P1 of the space 23 for allowing the nitrogen gas in the space 31 to the space 23 through the metal melt 190 in the event the pressure P2 is higher than the pressure P1 and blocks the connection between the outer reaction vessel 20 and the conduit 30 by the self gravity when P1≥P2. Thus, this check valve can be used also in the high-temperature region.

While explanation has been made with Embodiments 1-3 that the GaN crystal 550 of reduced threading dislocations is manufactured by growing GaN crystals on any of the base bodies 5, 5A, 5B and 5C consecutively under that condition where the oblique facets are formed and then under the condition that a flat surface is formed, the present invention is not limited to such specific examples, and any process may be employed in general as long as it is possible to manufacture a GaN crystal of reduced threading dislocations under the condition of deflecting the threading dislocations in the direction different from the crystal growth direction from the base body and then under the condition in which the condition in which the surface of the GaN crystal forms a generally perpendicular plane with regard to the growth direction from the base body.

Further, while it has been explained with Embodiments 1-3 that the crystal growth temperature is 800° C., the present embodiment is not limited to this specific crystal growth temperature. It is sufficient when the crystal growth temperature is equal to or higher than 600° with the present invention.

Further, it is sufficient that the nitrogen gas pressure may be any pressure as long as crystal growth of the present invention is possible under the pressurized state of 0.4 MPa or higher. Thus, the upper limit of the nitrogen gas pressure is not limited to 5.05 MPa but a pressure of 5.05 MPa or higher may also be used.

Further, while explanation has been made in the foregoing that metal Na and metal Ga are loaded into the reaction vessel 10 in the ambient of Ar gas and the metal Na is loaded between the reaction vessel 10 and the outer reaction vessel 20 in the ambient of Ar gas, it is also possible to load the metal Na and the metal Ga into the reaction vessel 10 and the metal Na between the reaction vessel 10 and the outer reaction vessel 20 and load the metal Li and metal Ga into the conduit 40 in the ambient of a gas other than the Ar gas, such as He, Ne, Kr, or the like, or in a nitrogen gas. Generally speaking, the metal Na and the metal Ga are loaded into the reaction vessel 10 and the metal Na is loaded between the reaction vessel 10 and the outer reaction vessel 20 and the metal Li and metal Ga into the conduit 40 in the ambient of an inert gas or nitrogen gas. In this case, the inert gas or the nitrogen gas should have the water content of 10 ppm or less and the oxygen content of 10 ppm or less.

Further, while explanation has been made in the foregoing that the metal that is mixed with the metal Ga is Na, the present embodiment is not limited to this particular case, but it is also possible to form the melt mixture 290 by mixing an alkali metal such as potassium (K), or the like, or an alkali earth metal such as magnesium (Mg), calcium (Ca), strontium (Sr), or the like, with the metal Ga. Thereby, it should be noted that the melt of the alkali metal forms an alkali metal melt while the melt of the alkali earth melt forms an alkali earth metal melt.

Further, in place of the nitrogen gas, it is also possible to use a compound containing therein nitrogen as a constituent element such as sodium azide, ammonia, or the like. These compounds constitute the nitrogen source gas.

Further, place of Ga, it is also possible to use a group III metal such as boron (B), aluminum (Al), indium (In), or the like.

Thus, the crystal growth method of the present invention is generally applicable to the manufacturing of a group III nitride crystal while using a melt mixture of an alkali metal or an alkali earth melt and a group III metal (including boron).

The group III nitride crystal manufactured with the crystal growth method of the present invention may be used for fabrication of group III nitride semiconductor devices including light-emitting diodes, laser diodes, photodiodes, transistors, and the like.

Further, in the present invention, it should be noted that "group III" means "group 111B" as defined in a periodic table of IUPAC (International Union of Pure and Applied Chemistry).

Further, it should be noted that the embodiments explained above are provided merely for the purpose of showing examples and should not be interpreted that the present invention is limited to such specific embodiments. The present invention is not limited to the embodiments described heretofore, but various variations and modifications may be made without departing from the scope of the invention as set forth in patent claims.

The present invention is applied to a group III nitride crystal of reduced threading dislocations manufactured by the crystal growth method that uses an alkali metal as the flux. Further, the present invention is applied to the manufacturing method of a group III nitride crystal that manufactures the group III nitride crystal of reduced threading dislocations by using an alkali metal for the flux.

The present invention is based on Japanese priority application 2005-335684 filed on Nov. 21, 2005, the entire contents of which are incorporated hereby as reference.

What is claimed is:

1. A GaN crystal, comprising:
a first GaN crystal formed over an underlying body such that at least a part of the first GaN crystal is in contact with the underlying body; and
a second GaN crystal in contact with the first GaN crytal, the second GaN crystal haying a surface formed of a c-surface,
wherein:
the first GaN crystal comprises a plurality of crystal regions (first domain) formed with an oblique facet, the plurality of crystal regions being free from Li or containing Li with a concentration lower than in the second GaN crystal;
the oblique facet forms a boundary between the first GaN crystal and the second GaN crystal;
threading dislocations propagating from the underlying body are deflected by the oblique facet in a direction perpendicular to a c-axis and are accumulated in a region where the second GaN crystal grown from adjacent first crystal domains meet with another second GaN crystal before the threading dislocations reach the c-surface of the second GaN crystal;
the second GaN crystal comprises a plurality of second domains bounded with threading dislocations reaching th c-surface;
a plurality of the second GaN crystal domains each extend in a c-axis direction;
surface threading dislocations are formed between adjacent second GaN crystal domains;
the second GaN crystal domains have a flat surface and comprise Li as an impurity with a concentration in the range of $10^{15}$-$10^{21}$ cm$^{-3}$;
the surface threading dislocations are formed on the c-surface of the GaN crystal such that a dislocation density of the surface threating dislocations is lower than a dislocation density of threading dislocations formed in the CaN crystal as a whole; and
the c-surface of the second GaN crystal does not have a dimple surface.

2. The GaN crystal of claim 1, wherein the surface threading dislocations are formed on the c-surface of the second GaN crystal with a dislocation density of about $10^4$ cm$^{-2}$.

3. The GaN crystal of claim 1, wherein the plurality of second domains are free from threading dislocations.

4. The GaN crystal of claim 1, wherein the second domains are formed on the c-surface of the second GaN crystal in a stripe form.

5. The GaN crystal of claim 2, wherein base threading dislocations of the GaN crystal have a dislocation density of $10^6$-$10^{10}$ cm$^{-2}$.

* * * * *